(12) United States Patent
Niino et al.

(10) Patent No.: US 11,965,650 B2
(45) Date of Patent: Apr. 23, 2024

(54) PHOTOCONVERSION DEVICE AND ILLUMINATION SYSTEM

(71) Applicant: KYOCERA Corporation, Kyoto (JP)

(72) Inventors: Noritaka Niino, Soraku-gun (JP); Ryuji Yamada, Minato-ku (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/915,793

(22) PCT Filed: Mar. 31, 2021

(86) PCT No.: PCT/JP2021/013930
§ 371 (c)(1),
(2) Date: Sep. 29, 2022

(87) PCT Pub. No.: WO2021/201129
PCT Pub. Date: Oct. 7, 2021

(65) Prior Publication Data
US 2023/0313974 A1  Oct. 5, 2023

(30) Foreign Application Priority Data

Mar. 31, 2020  (JP) ................. 2020-063762

(51) Int. Cl.
| | |
|---|---|
| F21V 9/32 | (2018.01) |
| F21V 7/08 | (2006.01) |
| F21V 7/30 | (2018.01) |
| F21V 8/00 | (2006.01) |
| F21V 29/505 | (2015.01) |
| F21V 29/70 | (2015.01) |

(52) U.S. Cl.
CPC ............ *F21V 9/32* (2018.02); *F21V 7/08* (2013.01); *F21V 7/30* (2018.02); *F21V 29/505* (2015.01); *F21V 29/70* (2015.01); *G02B 6/0008* (2013.01)

(58) Field of Classification Search
CPC .......... F21V 9/32; F21V 29/505; F21V 29/70; F21V 7/30; F21V 7/08; F21V 9/30; F21V 7/26; F21V 9/00; F21V 9/04; F21V 9/06; G02B 6/0008
See application file for complete search history.

(56) References Cited

U.S. PATENT DOCUMENTS

| | | | |
|---|---|---|---|
| 8,872,203 B2 | 10/2014 | Nagahama et al. | |
| 2004/0116033 A1* | 6/2004 | Ouderkirk ............ | H01L 33/505 |
| | | | 257/E33.072 |

(Continued)

FOREIGN PATENT DOCUMENTS

| | | |
|---|---|---|
| EP | 2650593 A1 | 10/2013 |
| JP | 2002-350654 A | 12/2002 |

(Continued)

*Primary Examiner* — Bao Q Truong
(74) *Attorney, Agent, or Firm* — Volpe Koenig

(57) ABSTRACT

A photoconversion device includes a first wavelength converter and a long-pass filter. The first wavelength converter receives excitation light from an output portion and emits fluorescence having a longer wavelength than the excitation light. The long-pass filter transmits the fluorescence emitted by the first wavelength converter and reflects the excitation light transmitted through or reflected from the first wavelength converter to enter the first wavelength converter.

10 Claims, 20 Drawing Sheets

(56) References Cited

U.S. PATENT DOCUMENTS

2007/0081336 A1* 4/2007 Bierhuizen ............ H04N 9/315
                                                    348/E9.027
2013/0250546 A1* 9/2013 Hu ........................... F21V 9/08
                                                    362/84
2013/0271947 A1* 10/2013 Finsterbusch ........... F21V 13/08
                                                    362/19

FOREIGN PATENT DOCUMENTS

| JP | 2010-178974 A | 8/2010 |
| JP | 50-83205 B2 | 11/2012 |
| JP | 2014-010918 A | 1/2014 |
| JP | 2014-503948 A | 2/2014 |
| JP | 2017-004967 A | 1/2017 |
| WO | 2016/167024 A1 | 10/2016 |

* cited by examiner

PHOTOCONVERSION DEVICE AND ILLUMINATION SYSTEM

CROSS-REFERENCE TO RELATED APPLICATION

The present application is a National Phase entry based on PCT Application No. PCT/JP2021/013930 filed on Mar. 31, 2021, entitled "OPTICAL CONVERTING DEVICE, AND ILLUMINATING SYSTEM", which claims the benefit of Japanese Patent Application No. 2020-063762, filed on Mar. 31, 2020, entitled "OPTICAL CONVERTING DEVICE, AND ILLUMINATING SYSTEM". The contents of which are incorporated by reference herein in their entirety.

FIELD

The present disclosure relates to a photoconversion device and an illumination system.

BACKGROUND

A known light-emitting device emits pseudo white light by converting monochromatic excitation light emitted by a laser diode (LD) or a light-emitting diode (LED) as a light-emitting element into light of different wavelengths with a fluorescent substance (refer to, for example, Japanese Patent No. 5083205).

SUMMARY

One or more aspects of the present disclosure are directed to a photoconversion device and an illumination system.

In one aspect, a photoconversion device includes a first wavelength converter and a long-pass filter. The first wavelength converter receives excitation light from an output portion and emits fluorescence having a longer wavelength than the excitation light. The long-pass filter transmits the fluorescence emitted by the first wavelength converter and reflects the excitation light transmitted through or reflected from the first wavelength converter to enter the first wavelength converter.

In one aspect, an illumination system includes a light-emitting module, a first optical transmission fiber, a relay, a second optical transmission fiber, and an optical radiation module. The light-emitting module emits excitation light. The first optical transmission fiber transmits the excitation light from the light-emitting module. The relay includes a photoconversion device that receives the excitation light transmitted by the first optical transmission fiber and emits fluorescence. The second optical transmission fiber transmits the fluorescence from the relay. The optical radiation module radiates the fluorescence transmitted by the second optical transmission fiber into an external space.

DESCRIPTION OF EMBODIMENTS

A known photoconversion device emits pseudo white light by converting monochromatic light emitted by a light-emitting element including a laser diode (LD) or a light-emitting diode (LED) into light of different wavelengths with a fluorescent substance. In this photoconversion device, for example, a solid photoconverter including phosphors receives monochromatic excitation light emitted by the LD and emits fluorescence.

However, a portion of the excitation light may, for example, pass through the photoconverter before being converted into fluorescence and may exit together with pseudo white light. Such a photoconversion device and an illumination system including the photoconversion device may be improved by increasing, for example, the amount of fluorescence emitted in response to excitation light.

The inventors of the present disclosure thus have developed a technique for increasing the amount of fluorescence emitted from the photoconversion device and the illumination system including the photoconversion device in response to excitation light.

Figure 3A:
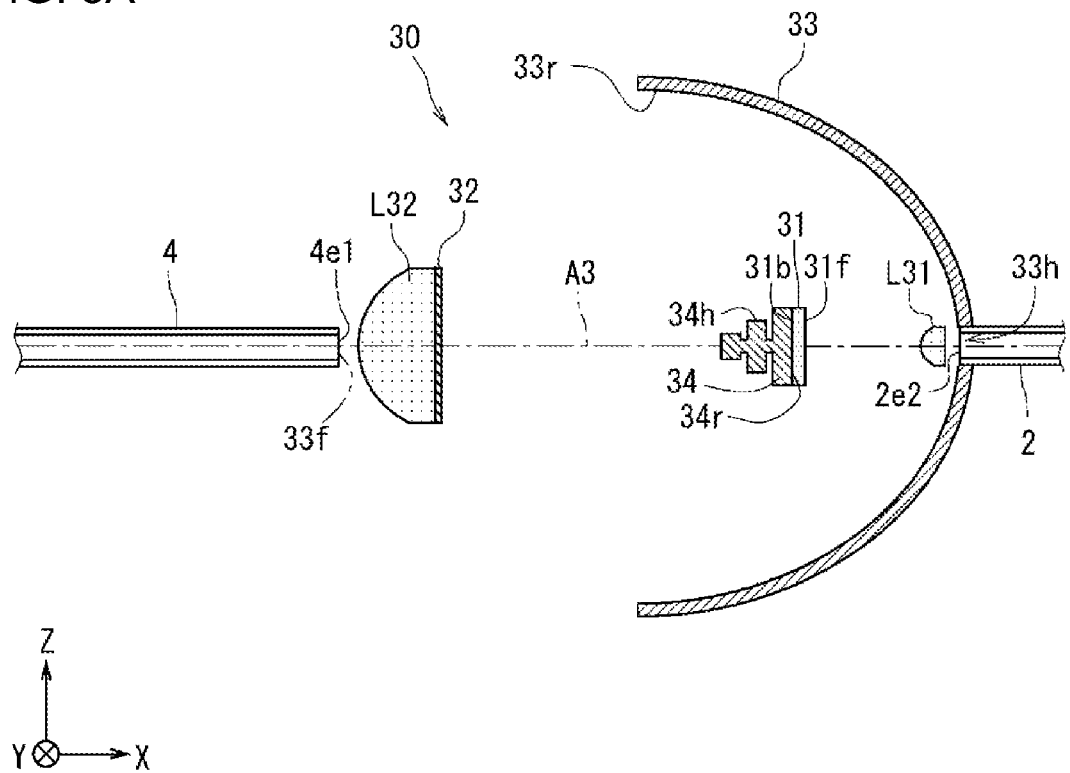
FIG. 3A is a schematic cross-sectional view of an example photoconversion device according to a second embodiment.
Figure 3B:
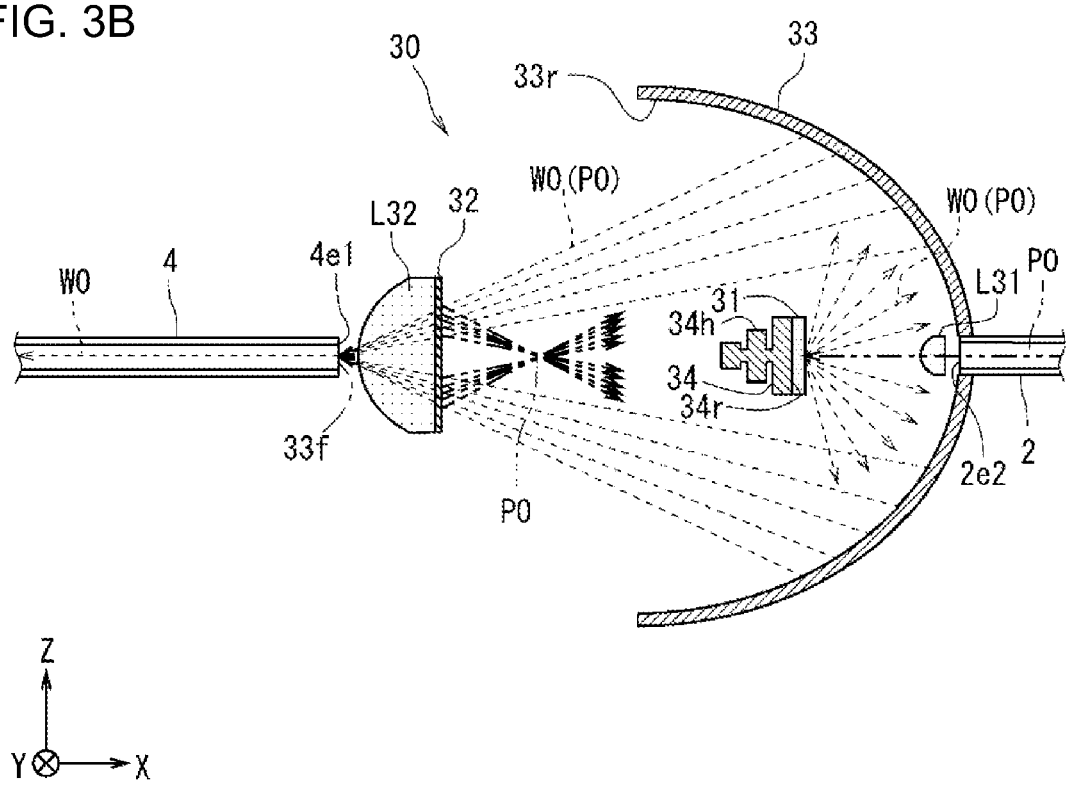
FIG. 3B is a schematic cross-sectional view of the photoconversion device according to the second embodiment illustrating conversion of excitation light into fluorescence.
Figure 4A:
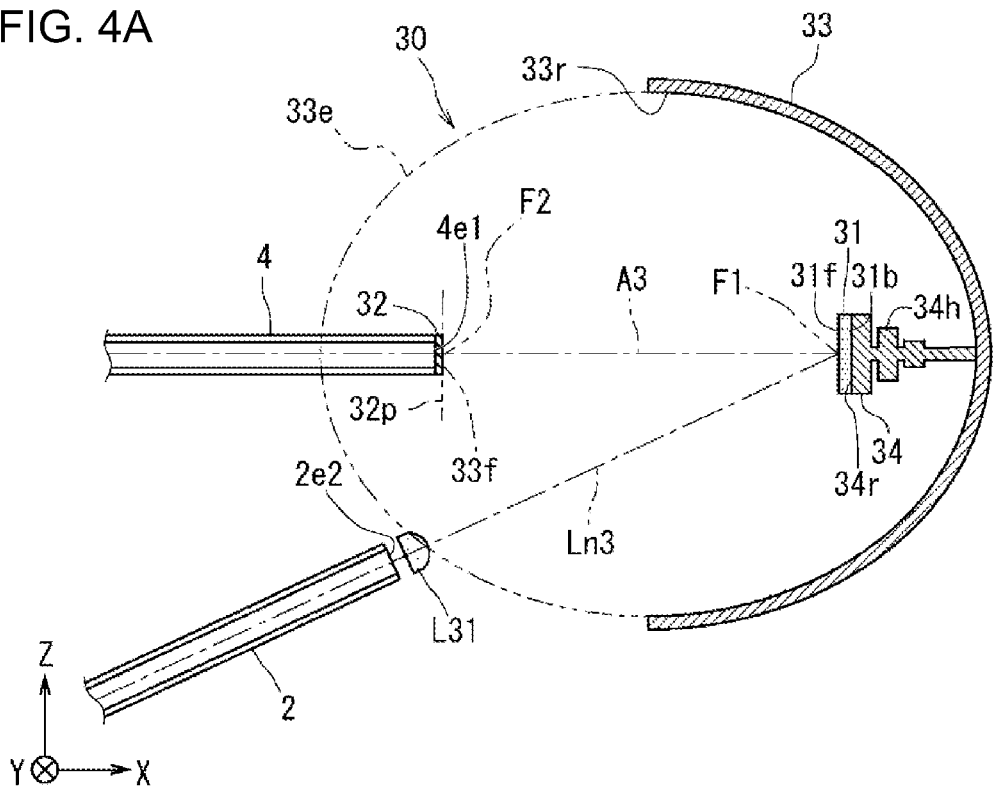
FIG. 4A is a schematic cross-sectional view of a photoconversion device with a first structure according to a third embodiment.
Figure 5A:
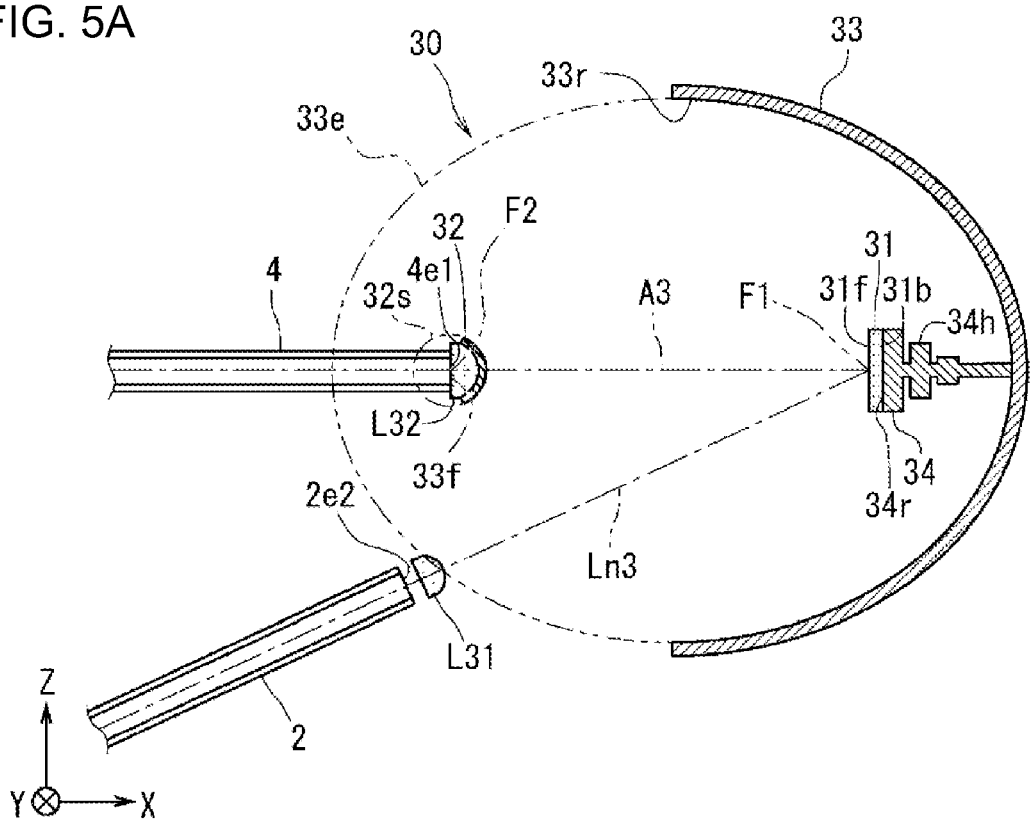
FIG. 5A is a schematic cross-sectional view of a photoconversion device with a second structure according to the third embodiment.
Figure 18A:
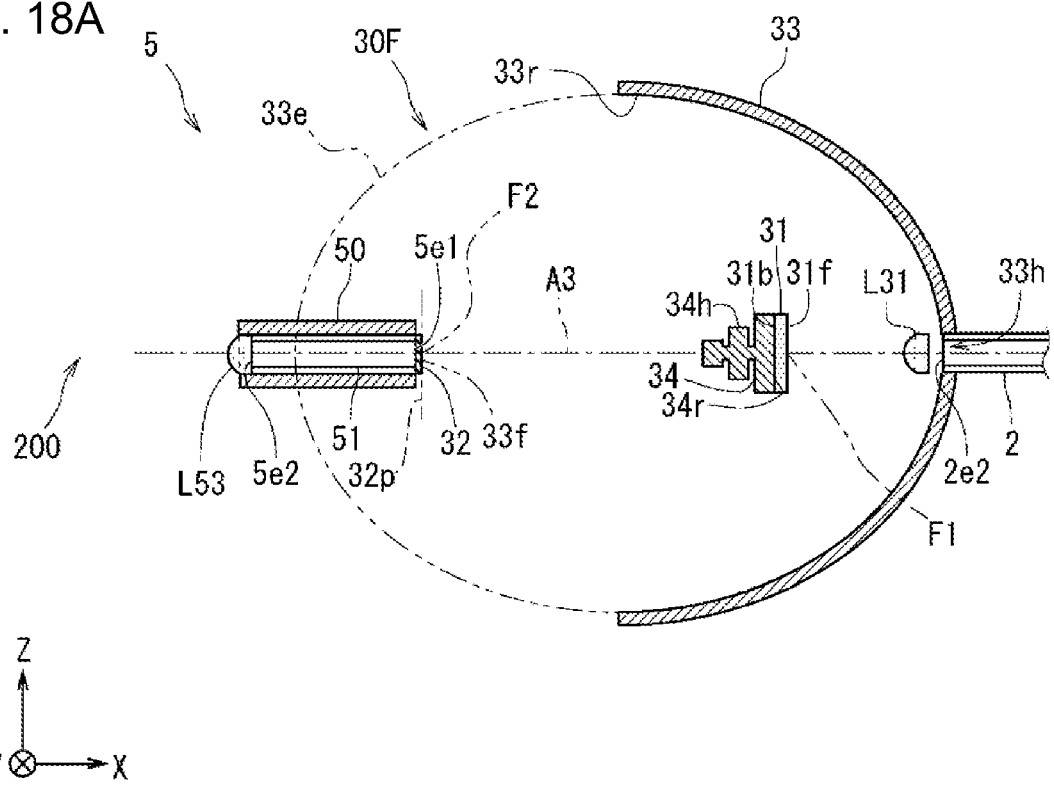
FIG. 18A is a schematic cross-sectional view of an optical radiation module with a first structure according to the seventh embodiment.
Figure 18B:
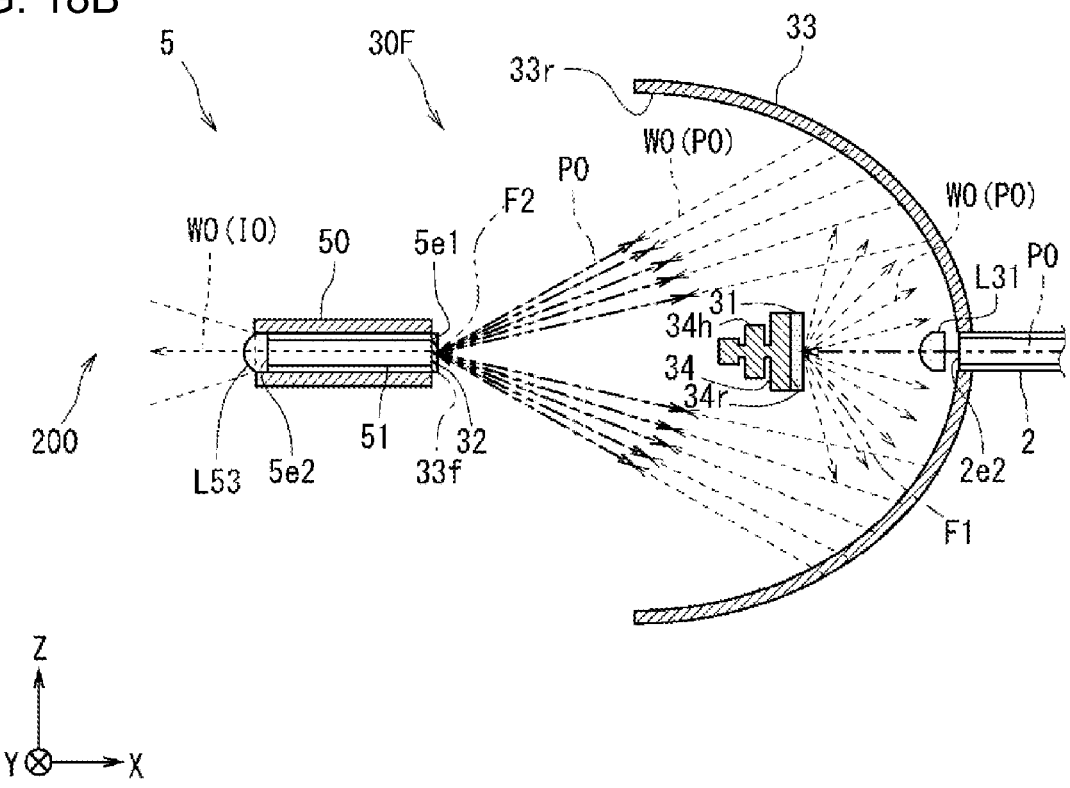
FIG. 18B is a schematic cross-sectional view of the optical radiation module with the first structure according to the seventh embodiment illustrating conversion of excitation light into fluorescence.
Figure 21A:
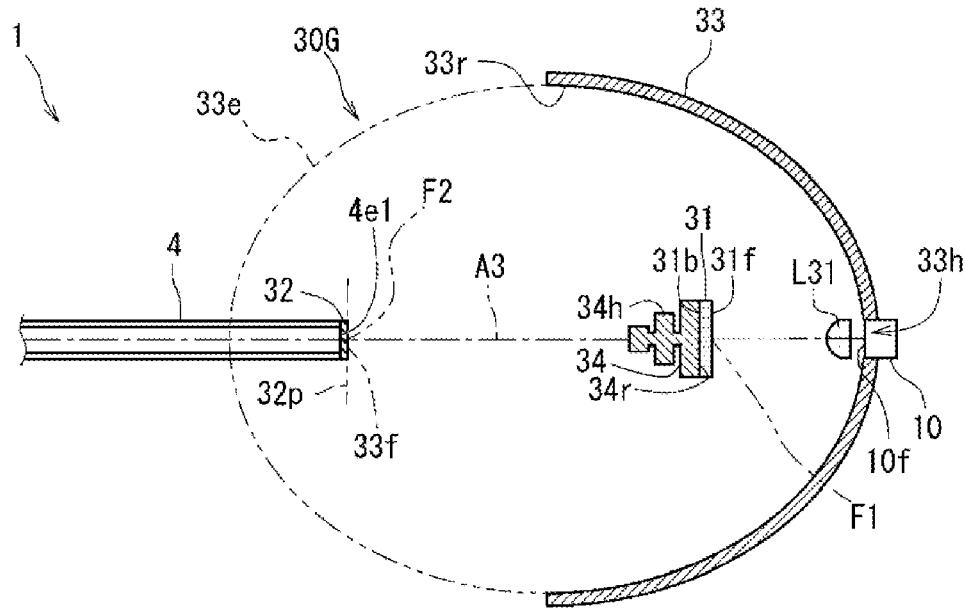
FIG. 21A is a schematic cross-sectional view of an example light-emitting module according to the eighth embodiment.
Figure 21B:
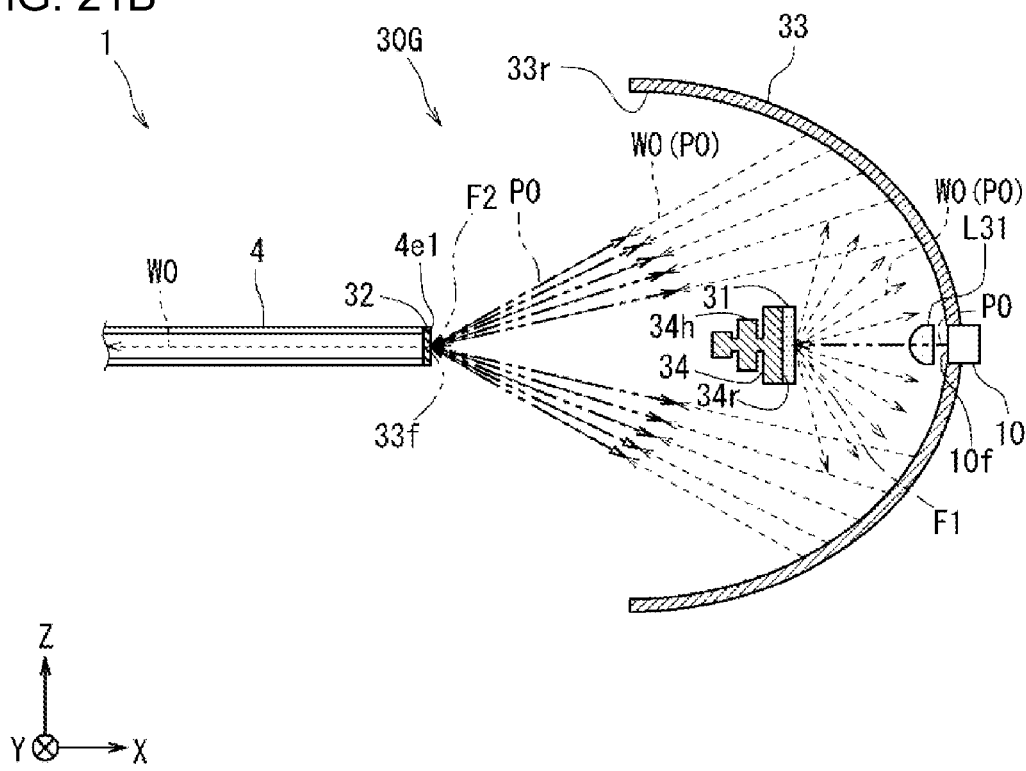
FIG. 21B is a schematic cross-sectional view of the light-emitting module according to the eighth embodiment illustrating conversion of excitation light into fluorescence.

Embodiments of the present disclosure will now be described with reference to the drawings. Throughout the drawings, the same reference numerals denote the same or similar components and functions, and such components and functions will not be described repeatedly. The drawings are schematic. FIGS. 2A to 16B, FIGS. 18A to 19B, and FIGS. 21A and 21B illustrate the right-handed XYZ coordinate system. In the XYZ coordinate system, the negative X-direction refers to the direction from a wavelength converter 31 to a long-pass filter 32 along an imaginary line A3 linking the center of the wavelength converter 31 and the center of the long-pass filter 32. The positive Y-direction refers to a direction perpendicular to the imaginary line A3, and the positive Z-direction refers to a direction perpendicular to the imaginary line A3 and orthogonal to both the positive X-direction and the positive Y-direction. In FIGS. 2A to 16B, a housing 3b of a relay 3 is not illustrated. In FIGS. 18A and 18B, a housing 5b of an optical radiation module 5 is not illustrated. In FIGS. 21A and 21B, a housing 1b of a light-emitting module 1 is not illustrated. In FIGS. 2B, 3B, 4B, 5B, 6B, 7B, 8B, 9B, 10B, 11B, 12B, 13B, 14B, 15B, 16B, 18B, 19B, and 21B, the direction in which excitation light P0 travels is indicated by arrowed two-dot chain lines, and the direction in which fluorescence W0 travels is indicated by arrowed dashed lines. In FIGS. 4A, 5A, 6A, 7A, 8A, 9A, 10A, 11A, 12A, 13A, 14A, 15A, 16A, 18A, and 21A, the outer edge of an imaginary ellipsoid 33e (described below) is indicated by a two-dot chain line. In FIGS. 4A and 6A, an imaginary plane 32p (described later) is indicated by a two-dot chain line. In FIGS. 5A and 7A, the outer edge of an imaginary sphere 32s (described later) is indicated by a two-dot chain line.

1. First Embodiment 1-1. Illumination System

Figure 1:
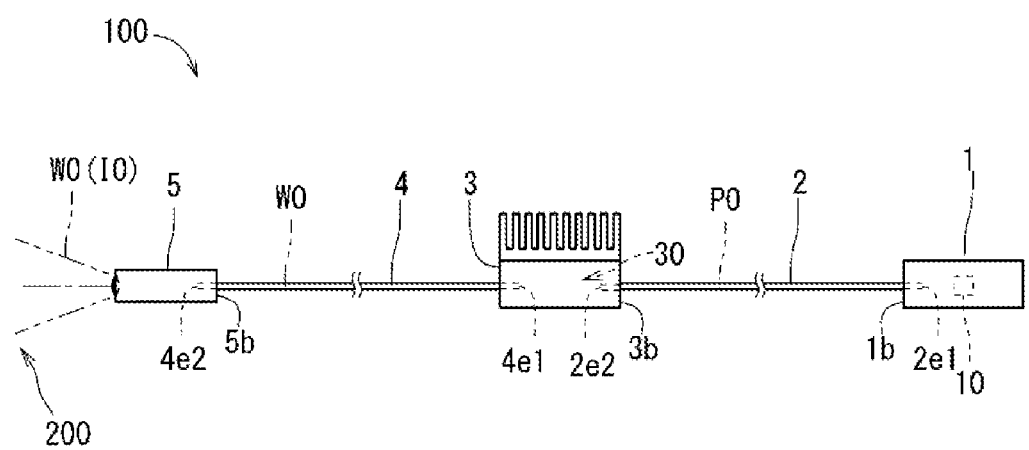
FIG. 1 is a schematic diagram of an example illumination system according to a first embodiment.

As illustrated in FIG. 1, an illumination system 100 according to a first embodiment includes, for example, the light-emitting module 1, a first optical transmission fiber 2, the relay 3, a second optical transmission fiber 4, and an optical radiation module 5.

The light-emitting module 1 can emit, for example, excitation light P0. The light-emitting module 1 includes a light-emitting element 10. The light-emitting element 10 includes, for example, an LD chip or an LED chip. The excitation light P0 emitted by the light-emitting element 10 is monochromatic light such as violet, blue-violet, or blue light. In the first embodiment, the light-emitting element 10 may be, for example, a gallium nitride (GaN) semiconductor laser device that emits violet laser light with 405 nanometers (nm). In the light-emitting module 1, for example, the excitation light P0 emitted by the light-emitting element 10 is directed to be focused on one end (also referred to as a first input end) 2e1 of the first optical transmission fiber 2 by an optical system for focusing light. The light-emitting module 1 includes, for example, the housing 1b accommodating various components.

The first optical transmission fiber 2 can transmit, for example, the excitation light P0 from the light-emitting module 1. In the first embodiment, the first optical transmission fiber 2 extends from the light-emitting module 1 to the relay 3. More specifically, the first optical transmission fiber 2 includes the first input end 2e1 in the longitudinal direction located inside the light-emitting module 1 and another end (also referred to as a first output end) 2e2 opposite to the first input end 2e1 in the longitudinal direction located inside the relay 3. Thus, the first optical transmission fiber 2 provides an optical transmission path for transmitting the excitation light P0 from the light-emitting module 1 to the relay 3. The first optical transmission fiber 2 may be, for example, an optical fiber. The optical fiber includes, for example, a core and a cladding. The cladding surrounds the core and has a lower refractive index of light than the core. In this case, for example, the first optical transmission fiber 2 can transmit the excitation light P0 in the longitudinal direction in the core. The first optical transmission fiber 2 has, in the longitudinal direction, a length of, for example, several tens of centimeters (cm) to several tens of meters (m).

The relay 3 includes, for example, a photoconversion device 30. The photoconversion device 30 can, for example, receive the excitation light P0 transmitted by the first optical transmission fiber 2 and emit fluorescence W0 having a wavelength different from the wavelength of the excitation light P0. In the first embodiment, the photoconversion device 30 receives, for example, the excitation light P0 output through the first output end 2e2 of the first optical transmission fiber 2. The first output end 2e2 serves as an output portion. The fluorescence W0 emitted from the photoconversion device 30 in response to the excitation light P0 includes, for example, red (R) light, green (G) light, and blue (B) light. The photoconversion device 30 can thus emit, for example, fluorescence W0 as pseudo white light in response to the monochromatic excitation light P0. The relay 3 includes, for example, the housing 3b accommodating various components. The housing 3b may include, for example, fins for dissipating heat generated by the photoconversion device 30 as the photoconversion device 30 receives the excitation light P0.

The second optical transmission fiber 4 can transmit, for example, the fluorescence W0 from the relay 3. In the first embodiment, the second optical transmission fiber 4 extends from the relay 3 to the optical radiation module 5. More specifically, the second optical transmission fiber 4 includes one end (also referred to as a second input end) 4e1 in the longitudinal direction located inside the relay 3 and another end (also referred to as a second output end) 4e2 opposite to the second input end 4e1 in the longitudinal direction located inside the optical radiation module 5. Thus, the second optical transmission fiber 4 provides an optical transmission path for transmitting the fluorescence W0 from the relay 3 to the optical radiation module 5. The second optical transmission fiber 4 may be, for example, an optical fiber. The optical fiber includes, for example, a core and a cladding. The cladding surrounds the core and has a lower refractive index of light than the core. In this case, for example, the second optical transmission fiber 4 can transmit the fluorescence W0 in the longitudinal direction in the core. The second optical transmission fiber 4 has, in the longitudinal direction, a length of, for example, several tens of centimeters to ten meters.

The optical radiation module 5 can radiate, for example, the fluorescence W0 transmitted by the second optical transmission fiber 4 into a space (also referred to as an external space) 200 outside the illumination system 100. The optical radiation module 5 illuminates an intended area in the external space 200 with the fluorescence W0 as illumination light I0 through, for example, a lens or a diffuser. The optical radiation module 5 includes, for example, the housing 5b accommodating various components.

In the illumination system 100 with the above structure, for example, the photoconversion device 30 emits fluorescence W0 in response to the excitation light P0 transmitted by the first optical transmission fiber 2 from the light-emitting module 1. This structure can, for example, shorten the distance over which the fluorescence W0 is transmitted by the optical transmission fiber. The structure thus reduces light loss (also referred to as optical transmission loss) that may occur when, for example, the fluorescence W0 travels in the optical transmission fiber in a direction inclined at various angles to the longitudinal direction of the optical transmission fiber and is partly scattered during transmission. Thus, the illumination system 100 can radiate, for example, more fluorescence W0 in response to the excitation light P0. In this example, the optical radiation module 5 does not include the photoconversion device 30. The optical radiation module 5 is thus less likely to undergo temperature increase and is easily miniaturized. The structure thus allows, for example, miniaturization of the optical radiation module 5 that radiates illumination light I0 into the external space 200 of the illumination system 100 while increasing the amount of fluorescence W0 emitted from the illumination system 100 in response to the excitation light P0.

1-2. Photoconversion Device

Figure 2A:
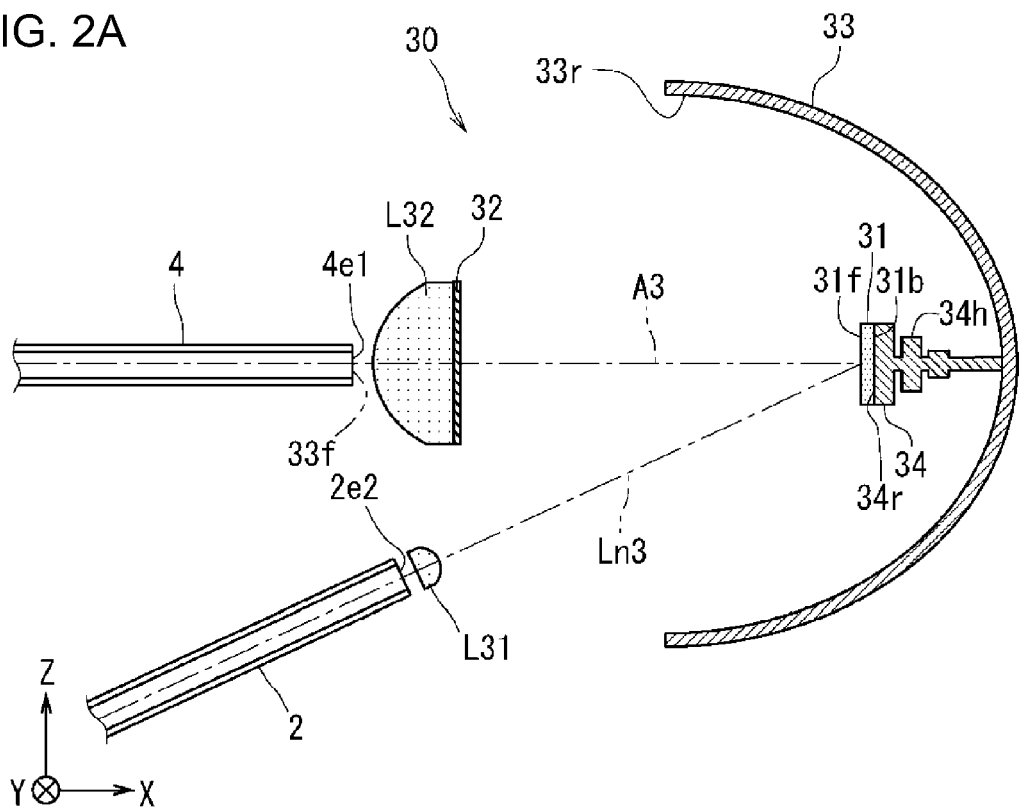
FIG. 2A is a schematic cross-sectional view of an example photoconversion device according to the first embodiment.

As illustrated in FIG. 2A, the photoconversion device 30 according to the first embodiment includes, for example, the wavelength converter 31 as a first wavelength converter and the long-pass filter 32. These components of the photoconversion device 30 are fixed directly to the housing 3b of the relay 3 or indirectly to the housing 3b of the relay 3 with, for example, another member located between each component and the housing 3b.

Figure 2B:
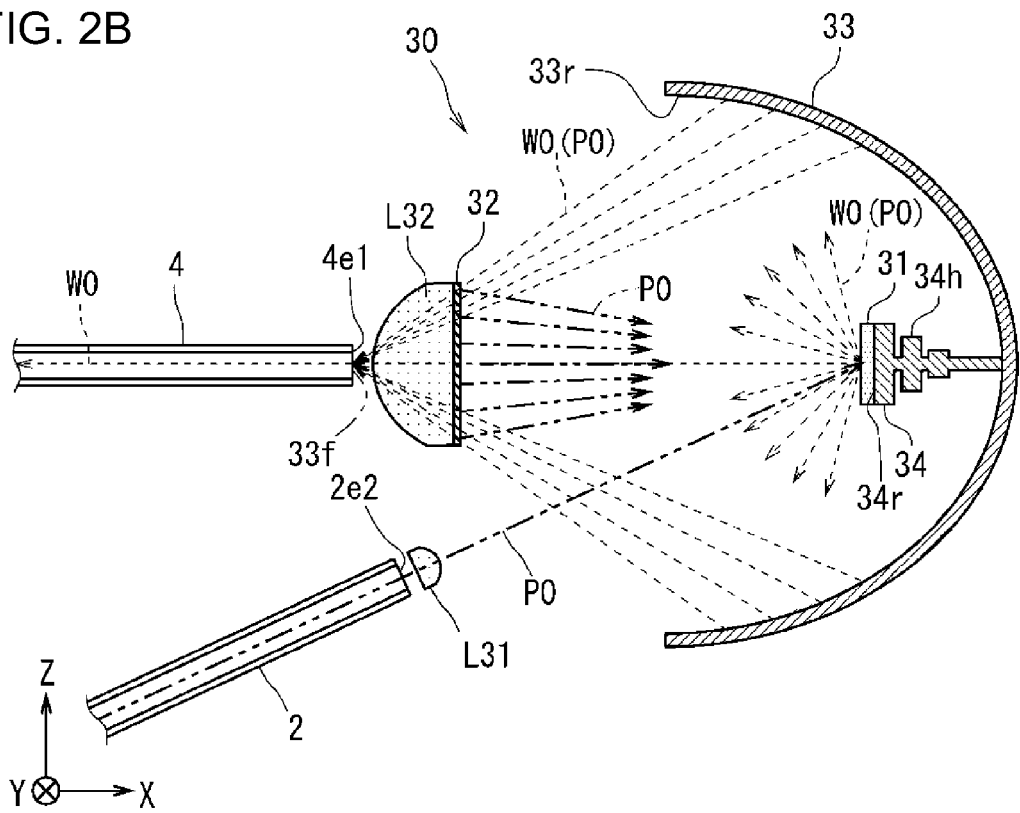
FIG. 2B is a schematic cross-sectional view of the photoconversion device according to the first embodiment illustrating conversion of excitation light into fluorescence.

For example, the wavelength converter 31 can receive the excitation light P0 output through the first output end 2e2 as the output portion and emit fluorescence W0 having a wavelength different from the wavelength of the received excitation light P0, as illustrated in FIG. 2B. The fluorescence W0 has, for example, a longer wavelength than the excitation light P0. The wavelength converter 31 has, for example, a surface (also referred to as a front surface) 31f to receive the excitation light P0 output through the first output end 2e2 as the output portion, and a surface (also referred to as a back surface) 31b opposite to the front surface 31f. In the first embodiment, for example, the front surface 31f faces in the negative X-direction, and the back surface 31b faces in the positive X-direction. The wavelength converter 31 is, for example, a flat plate or a film. In this example, the first output end 2e2 of the first optical transmission fiber 2 is located on an imaginary line Ln3 inclined with respect to the imaginary line A3 extending along the normal to the front surface 31f. Thus, for example, the excitation light P0 output through the first output end 2e2 is obliquely incident on the front surface 31f of the wavelength converter 31. In this example, the front surface 31f and the back surface 31b may each be a planar surface, such as a circular surface or a polygonal surface, or a non-planar surface, such as a curved surface or an uneven surface. In such cases, the imaginary line A3 may be, for example, a straight imaginary line passing through the wavelength converter 31 and the second input end 4e1.

The wavelength converter 31 includes, for example, a solid member including phosphors (also referred to as a phosphor member). The phosphor member may be, for example, a pellet-like member (also referred to as a phosphor pellet) including many phosphor particles of multiple types that each emit fluorescence in response to the excitation light P0. The phosphor particles are contained in a transparent material such as resin or glass. In this example, the phosphor member may include a transparent substrate, such as a resin substrate or a glass substrate, and phosphor pellets on the substrate. The multiple types of phosphors include, for example, a phosphor that emits fluorescence of a first color in response to the excitation light P0 and a phosphor that emits fluorescence of a second color different from the first color in response to the excitation light P0. In the first embodiment, the multiple types of phosphors include, for example, a phosphor that emits red (R) fluorescence in response to the excitation light P0 (also referred to as a red phosphor), a phosphor that emits green (G) fluorescence in response to the excitation light P0 (also referred to as a green phosphor), and a phosphor that emits blue (B) fluorescence in response to the excitation light P0 (also referred to as a blue phosphor). In another example, the multiple types of phosphors may include, for example, a phosphor that emits blue-green fluorescence in response to the excitation light P0 (also referred to as a blue-green phosphor), a phosphor that emits yellow fluorescence in response to the excitation light P0 (also referred to as a yellow phosphor), and other various phosphors that each emit fluorescence of a different wavelength in response to the excitation light P0.

The red phosphor is, for example, a phosphor with a peak wavelength of fluorescence emitted in response to the excitation light P0 in a range of about 620 to 750 nm. The red phosphor material is, for example, $CaAlSiN_3$:Eu, $Y_2O_2S$:Eu, $Y_2O_3$:Eu, $SrCaClAlSiN_3$:$Eu^{2+}$, $CaAlSiN_3$:Eu, or $CaAlSi(ON)_3$:Eu. The green phosphor is, for example, a phosphor with a peak wavelength of fluorescence emitted in response to the excitation light P0 in a range of about 495 to 570 nm. The green phosphor material is, for example, β-SiAlON:Eu, $SrSi_2(O, Cl)_2N_2$:Eu, $(Sr, Ba, Mg)_2SiO_4$:$Eu^{2+}$, ZnS:Cu, Al, or $Zn_2SiO_4$:Mn. The blue phosphor is, for example, a phosphor with a peak wavelength of fluorescence emitted in response to the excitation light P0 in a range of about 450 to 495 nm. The blue phosphor material is, for example, $(Ba, Sr)MgAl_{10}O_{17}$:Eu, $BaMgAl_{10}O_{17}$:Eu, $(Sr, Ca, Ba)_{10}(PO_4)_6Cl_2$:Eu, or $(Sr, Ba)_{10}(PO_4)_6Cl_2$:Eu. The blue-green phosphor is, for example, a phosphor with a peak wavelength of fluorescence emitted in response to the excitation light P0 at about 495 nm. The blue-green phosphor material is, for example, $(Sr, Ba, Ca)_5(PO_4)_3Cl$:Eu or $Sr_4Al_{14}O_{25}$:Eu. The yellow phosphor is, for example, a phosphor with a peak wavelength of fluorescence emitted in response to the excitation light P0 in a range of about 570 to 590 nm. The yellow phosphor material is, for example, $SrSi_2(O, Cl)_2N_2$:Eu. The ratio of the elements in the parentheses herein may be changed as appropriate without deviating from the molecular formulas.

The long-pass filter 32 transmits, for example, the fluorescence W0 emitted by the wavelength converter 31. The long-pass filter 32 thus transmits, for example, the fluorescence W0 emitted by the wavelength converter 31 toward the second input end 4e1 of the second optical transmission fiber 4. The long-pass filter 32 can also reflect, for example, the excitation light P0 transmitted through or reflected from the wavelength converter 31 to enter the wavelength converter 31. In this example, the long-pass filter 32 can reflect the excitation light P0 transmitted through or reflected from the wavelength converter 31 toward the wavelength converter 31. The long-pass filter 32 can also reflect the excitation light P0 onto the wavelength converter 31 through a reflective surface 33r, in addition to reflecting the excitation light P0 directly onto the wavelength converter 31 alone. The wavelength converter 31 can thus, for example, emit more fluorescence W0 with the excitation light P0 reflected from the long-pass filter 32. This increases the amount of fluorescence W0 emitted from the photoconversion device 30 and the illumination system 100 in response to the excitation light P0.

In the first embodiment, the long-pass filter 32 faces, for example, the front surface 31f of the wavelength converter 31. More specifically, the long-pass filter 32 includes, for example, a plate or film extending on a YZ plane. The long-pass filter 32 includes a filter that reflects light having a wavelength shorter than a predetermined wavelength and transmits light having a wavelength longer than the predetermined wavelength. The predetermined wavelength is set, for example, near the boundary between the wavelength range of violet light from 380 to 450 nm and the wavelength range of blue light from 450 to 495 nm. More specifically, the predetermined wavelength is set to, for example, about 420 to 450 nm. The long-pass filter 32 includes, for example, a member including a transparent substrate and a dielectric multilayer film located on the transparent substrate. The transparent substrate transmits, for example, visible light rays. The material for the transparent substrate is, for example, glass such as silicon dioxide ($SiO_2$) crystals or $SiO_2$ compounds. Other various examples of the material for the transparent substrate may include crystals of GaN, magnesium oxide (MgO), aluminum nitride (AlN), aluminum oxide ($Al_2O_3$), yttrium aluminum garnet (YAG), yttrium oxide ($Y_2O_3$), and carbon (C). The dielectric multilayer film includes, for example, dielectric thin films repeatedly stacked on one another. The dielectric includes, for example, at least one material selected from the group consisting of titanium dioxide ($TiO_2$), $SiO_2$, niobium pentoxide ($Nb_2O_5$), tantalum pentoxide ($Ta_2O_5$), and magnesium fluoride ($MgF_2$).

In the first embodiment, the photoconversion device 30 includes, for example, a focusing reflector 33. The focusing reflector 33 directs the fluorescence W0 emitted by the wavelength converter 31 to be focused on a focusing plane 33f. The focusing reflector 33 is, for example, a parabolic reflector. The focusing reflector 33 has, for example, a concave or ellipsoidal reflective surface 33r surrounding the wavelength converter 31. More specifically, the reflective surface 33r is, for example, recessed in the positive X-direction. The imaginary YZ cross section of the reflective surface 33r is, for example, circular. In the examples of FIGS. 2A and 2B, the imaginary YZ cross section of the reflective surface 33r is circular and centered at a point on the imaginary line A3 linking the center of the wavelength converter 31 and the center of the long-pass filter 32. The imaginary circular cross section of the reflective surface 33r along a YZ plane has a maximum diameter of, for example, about 5 to 6 cm. The focusing plane 33f may be, for example, either an imaginary plane or an actual surface.

In one example, the long-pass filter 32 may be located on the focusing plane 33f or on the optical path of the fluorescence W0 from the wavelength converter 31 to the focusing plane 33f. This example structure may increase the amount of fluorescence W0 focused on the focusing plane 33f. For example, as illustrated in FIGS. 2A and 2B, the focusing plane 33f aligned with the input end (second input end) 4e1 of the second optical transmission fiber 4 may increase the amount of fluorescence W0 transmitted by the second optical transmission fiber 4.

In the first embodiment, the photoconversion device 30 includes, for example, a reflective member 34. The reflective member 34 is, for example, in contact with the back surface 31b of the wavelength converter 31 opposite to the front surface 31f to receive the excitation light P0. This allows, for example, the excitation light P0 that has passed through the wavelength converter 31 to be reflected from the reflective member 34 and enters the wavelength converter 31 again. This may increase, for example, the fluorescence W0 emitted by the wavelength converter 31. This may thus increase, for example, the amount of fluorescence W0 emitted in response to the excitation light P0. The reflective member 34 includes, for example, a reflective surface 34r on a YZ plane and in contact with the back surface 31b. The reflective member 34 may be made of, for example, a metal material. Examples of the metal material include copper, aluminum, magnesium, gold, silver, iron, chromium, cobalt, beryllium, molybdenum, tungsten, and alloys of these metals. The reflective member 34 may include, for example, a non-metal body on which a thin film of a metal material to be the reflective surface 34r is formed by vapor deposition. Examples of the non-metal material may include AlN, silicon nitride ($Si_3N_4$), C, and $Al_2O_3$.

In the first embodiment, the reflective member 34 functions as, for example, a heat sink 34h. The heat sink 34h includes, for example, heat-dissipating fins. The heat sink 34h thus has, for example, a larger surface area than the wavelength converter 31. The heat sink 34h can accelerate, for example, cooling of the wavelength converter 31, which generates heat under irradiation with the excitation light P0. This reduces, for example, the temperature increase in the wavelength converter 31 to reduce performance degradation of the wavelength converter 31 resulting from overheating.

In the first embodiment, the wavelength converter 31 is fixed to the focusing reflector 33 with, for example, the reflective member 34 extending in the positive X-direction from the back surface 31b between the wavelength converter 31 and the focusing reflector 33. The wavelength converter 31 may be, for example, fixed to the focusing reflector 33 with, for example, a thin rod. The thin rod may be made of a material that transmits visible light rays, such as resin or glass, or a material that blocks visible light rays, such as a metal material.

As illustrated in FIGS. 2A and 2B, the photoconversion device 30 may also include an optical system L31 including, for example, a lens that directs the excitation light P0 output through the first output end 2e2 of the first optical transmission fiber 2 to be focused on the wavelength converter 31. The optical system L31 may include, for example, a reflective mirror, or may be eliminated.

As illustrated in FIGS. 2A and 2B, the photoconversion device 30 may also include an optical system L32 including, for example, a lens that directs the fluorescence W0 transmitted through the long-pass filter 32 to be focused on the input end (second input end) 4e1 of the second optical transmission fiber 4. In this case, for example, the long-pass filter 32 may be located on a surface of the optical system L32 as illustrated in FIGS. 2A and 2B. This facilitates, for example, placement of the long-pass filter 32. The optical system L32 may include, for example, a reflective mirror, or may be eliminated.

1-3. Overview of First Embodiment

In the first embodiment, the photoconversion device 30 includes the long-pass filter 32 that transmits, for example, the fluorescence W0 emitted by the wavelength converter 31 in response to irradiation with the excitation light P0 toward the second input end 4e1 and reflects the excitation light P0 transmitted through or reflected from the wavelength converter 31 to enter the wavelength converter 31. The wavelength converter 31 can thus emit, for example, more fluorescence W0 with the excitation light P0 reflected from the long-pass filter 32. This may increase, for example, the amount of fluorescence W0 emitted from the photoconversion device 30 and the illumination system 100 in response to the excitation light P0.

2. Other Embodiments

The present disclosure is not limited to the above first embodiment and may be changed or modified in various manners without departing from the spirit and scope of the present disclosure.

2-1. Second Embodiment

In the above first embodiment, the positions of, for example, the wavelength converter 31, the first output end 2e2, and the reflective member 34 may be changed as appropriate. For example, as illustrated in FIGS. 3A and 3B, the wavelength converter 31 may be between the first output end 2e2 as the output portion and the long-pass filter 32. This allows, for example, the first output end 2e2, the wavelength converter 31, and the long-pass filter 32 to be aligned on a straight line. The photoconversion device 30 is thus less likely to be larger.

In a second embodiment, the photoconversion device 30 illustrated in FIGS. 3A and 3B includes, for example, the wavelength converter 31 with its front surface 31f facing in the positive X-direction and its back surface 31b facing in the negative X-direction. The reflective member 34 extends, for example, in the negative X-direction from the back surface 31b. The focusing reflector 33 includes, for example, a through-hole 33h aligned with the imaginary line A3 extending along the normal to the front surface 31f. The first optical transmission fiber 2 may have its portion including the first output end 2e2 received in the through-hole 33h. The first output end 2e2 is, for example, on the imaginary line A3 extending along the normal to the front surface 31f. In this example, the front surface 31f may be a planar surface, such as a circular surface or a polygonal surface, or a non-planar surface, such as a curved surface or an uneven surface. In such cases, the imaginary line A3 may be, for example, a straight imaginary line passing through the wavelength converter 31 and the second input end 4e1.

In this structure, for example, as illustrated in FIG. 3B, the wavelength converter 31 receives the excitation light P0 output in the negative X-direction through the first output end 2e2 on the front surface 31f and emits fluorescence W0 having a longer wavelength than the received excitation light P0. In this example, the excitation light P0 that has passed through the wavelength converter 31 is reflected from the reflective member 34 and enters the wavelength converter 31 again, thus increasing the fluorescence W0 emitted by the wavelength converter 31. The fluorescence W0 emitted by the wavelength converter 31 is then, for example, reflected from the focusing reflector 33, passes through the long-pass filter 32, and enters the second optical transmission fiber 4 through the second input end 4e1. The long-pass filter 32 reflects, for example, the excitation light P0 transmitted through or reflected from the wavelength converter 31 and then reflected from the focusing reflector 33 to enter the wavelength converter 31. This allows, for example, the wavelength converter 31 to emit more fluorescence W0 with the excitation light P0 reflected from the long-pass filter 32, thus increasing the amount of fluorescence W0 emitted from the photoconversion device 30 and the illumination system 100 in response to the excitation light P0.

2-2. Third Embodiment

In each of the above embodiments, the focusing reflector 33 may be, for example, a reflector (also referred to as an ellipsoidal mirror) including a reflective surface 33r extending along an imaginary ellipsoid 33e, and the imaginary ellipsoid 33e may include two focal points with a first focal point F1 located in or along the wavelength converter 31 and a second focal point F2 different from the first focal point F1 located on or along the focusing plane 33f, as illustrated in FIGS. 4A to 7B. In this example, the optical system L32 may be eliminated. The location along the focusing plane 33$f$ refers to, for example, a location slightly off the focusing plane 33$f$ and within the focusing plane 33$f$ in a plan view of the focusing plane 33$f$. This example structure may increase the amount of fluorescence W0 emitted by the wavelength converter 31 to be focused on the focusing plane 33$f$.

Figure 4B:
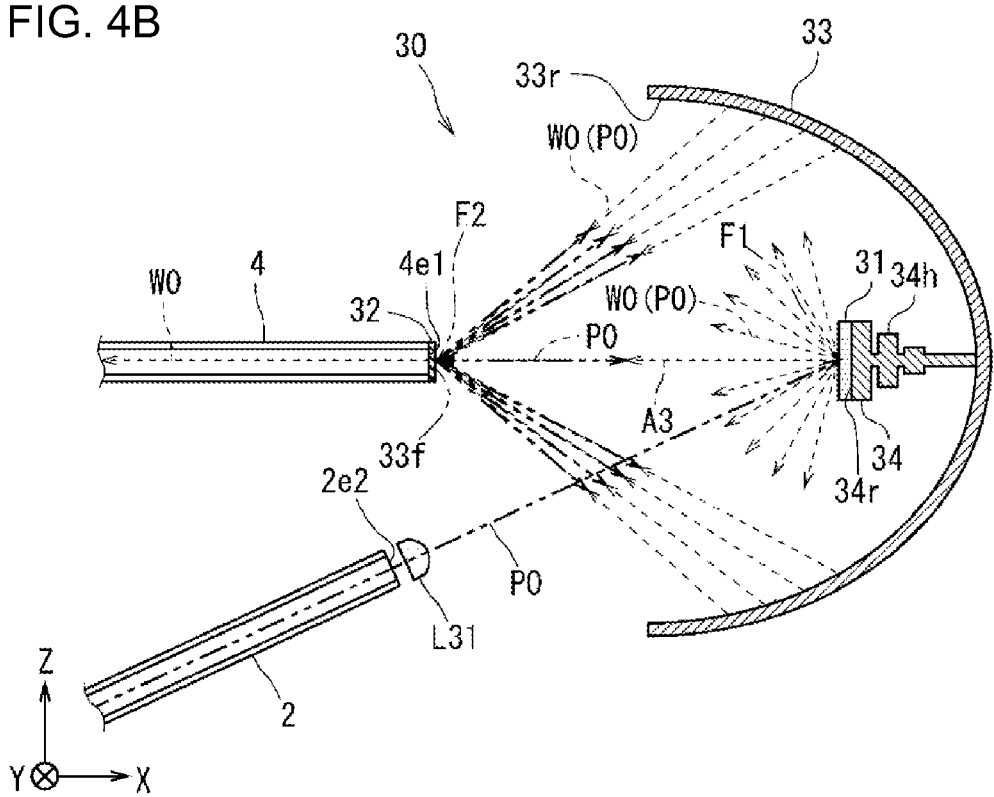
FIG. 4B is a schematic cross-sectional view of the photoconversion device with the first structure according to the third embodiment illustrating conversion of excitation light into fluorescence.

In this example, as illustrated in FIGS. 4A and 4B, the long-pass filter 32 may have a shape including a surface along an imaginary plane 32$p$ aligned with the focusing plane 33$f$ and perpendicular to the straight imaginary line A3 passing through the first focal point F1 and the second focal point F2. In this example, the excitation light P0 transmitted through or reflected from the wavelength converter 31 is reflected from the reflective surface 33$r$ to the long-pass filter 32 and then reflected from the long-pass filter 32. In this case, for example, the excitation light P0 from the long-pass filter 32 reaches the wavelength converter 31 through the reflective surface 33$r$ along an optical path (also referred to as a return path) that is symmetrical with, about the imaginary line A3, the optical path (also referred to as an outward path) of the excitation light P0 from the wavelength converter 31 to the long-pass filter 32 through the reflective surface 33$r$. The wavelength converter 31 can thus emit, for example, more fluorescence W0. This may increase, for example, the amount of fluorescence W0 emitted from the photoconversion device 30 and the illumination system 100 in response to the excitation light P0.

A photoconversion device 30 with a first structure according to a third embodiment illustrated in FIGS. 4A and 4B is based on the photoconversion device 30 according to the first embodiment illustrated in FIGS. 2A and 2B, with the shapes, positions, and other structures of the components being changed appropriately. In the photoconversion device 30 with the first structure according to the third embodiment, the optical system L32 is eliminated, the focusing reflector 33 is an ellipsoidal mirror, the first focal point F1 is on the front surface 31$f$ of the wavelength converter 31, the second focal point F2 is along the focusing plane 33$f$, and the long-pass filter 32 has the shape including the surface along the imaginary plane 32$p$ aligned with the focusing plane 33$f$, located on the second input end 4$e$1, and perpendicular to the straight imaginary line A3 passing through the first focal point F1 and the second focal point F2.

Figure 5B:
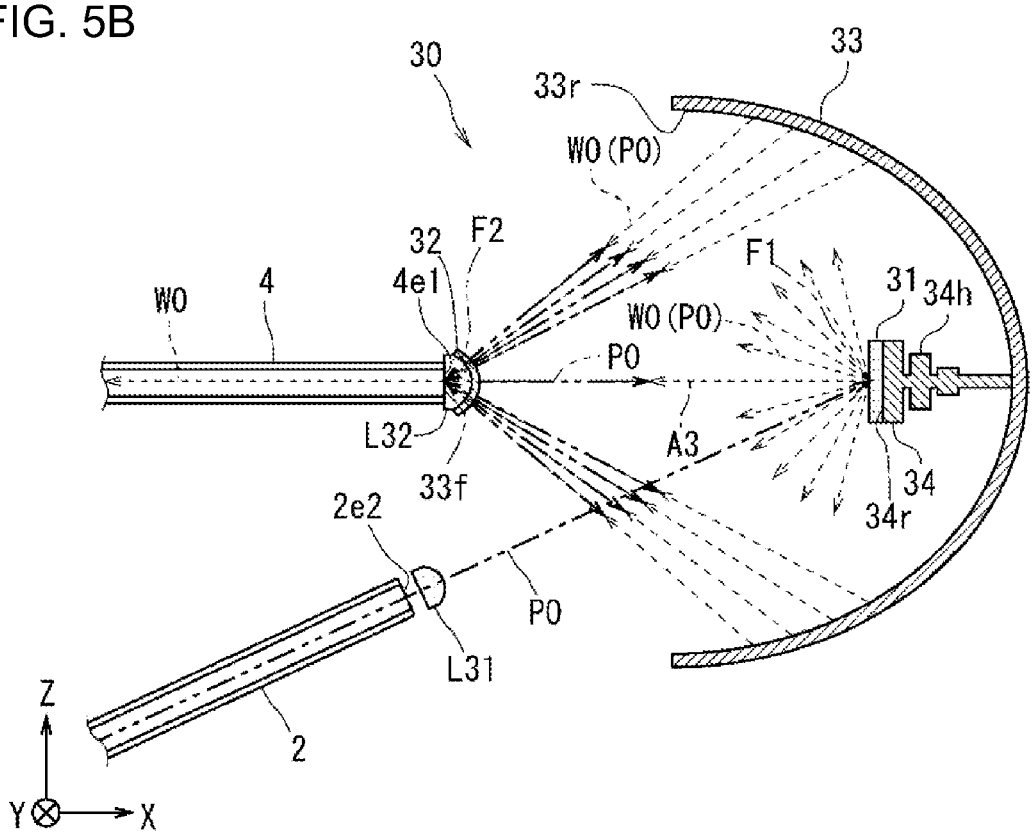
FIG. 5B is a schematic cross-sectional view of the photoconversion device with the second structure according to the third embodiment.
Figure 6A:
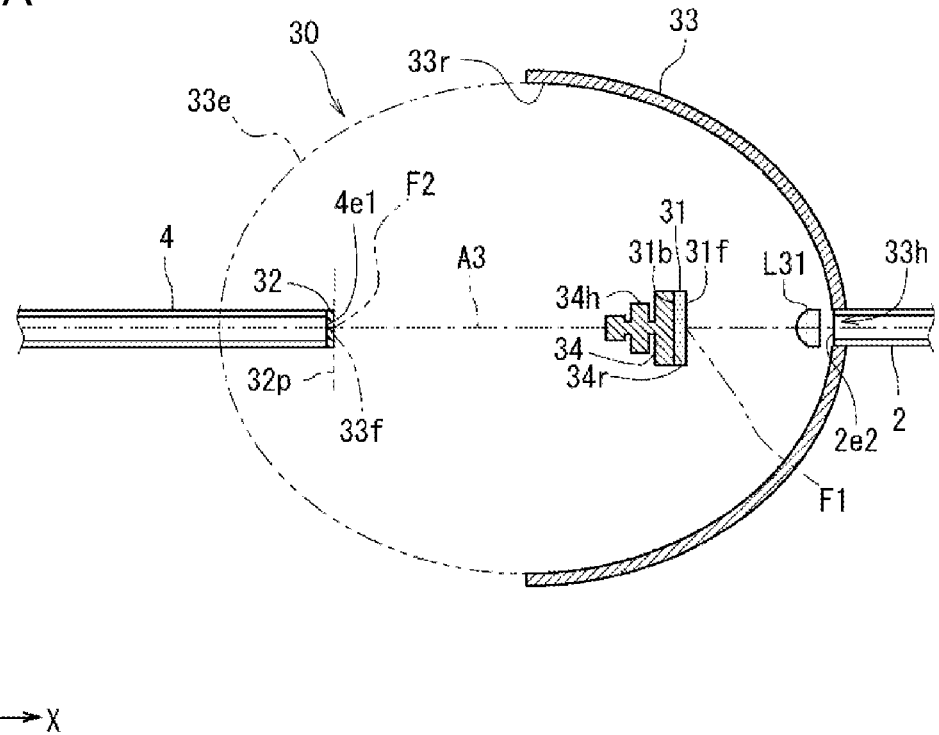
FIG. 6A is a schematic cross-sectional view of a photoconversion device with a third structure according to the third embodiment.

In another example, as illustrated in FIGS. 5A and 5B, the long-pass filter 32 may have a convex shape facing the first focal point F1 and a surface along an imaginary sphere 32$s$ centered at the second focal point F2. The long-pass filter 32 with the surface along the imaginary sphere 32$s$ includes, for example, a member including a dielectric multilayer film located on a hemispherical surface of a transparent body or a substrate included in the optical system L32. In this example, the excitation light P0 transmitted through or reflected from the wavelength converter 31 is reflected from the reflective surface 33$r$ to the long-pass filter 32 and then reflected from the long-pass filter 32. In this case, the excitation light P0 from the long-pass filter 32 reaches the wavelength converter 31 through the reflective surface 33$r$ by following, in the opposite direction, the optical path of the excitation light P0 from the wavelength converter 31 to the long-pass filter 32 through the reflective surface 33$r$. The wavelength converter 31 can thus emit, for example, more fluorescence W0. This may increase, for example, the amount of fluorescence W0 emitted from the photoconversion device 30 and the illumination system 100 in response to the excitation light P0.

A photoconversion device 30 with a second structure according to the third embodiment illustrated in FIGS. 5A and 5B is based on the photoconversion device 30 with the first structure according to the third embodiment illustrated in FIGS. 4A and 4B, with the shapes, positions, and other structures of the components being changed appropriately. In the photoconversion device 30 with the second structure according to the third embodiment, a hemispherical transparent body included in the optical system L32 is located along the second input end 4$e$1, and the long-pass filter 32 is located along a curved surface along the imaginary sphere 32$s$ that has a convex shape facing the first focal point F1 and is centered at the second focal point F2.

Figure 6B:
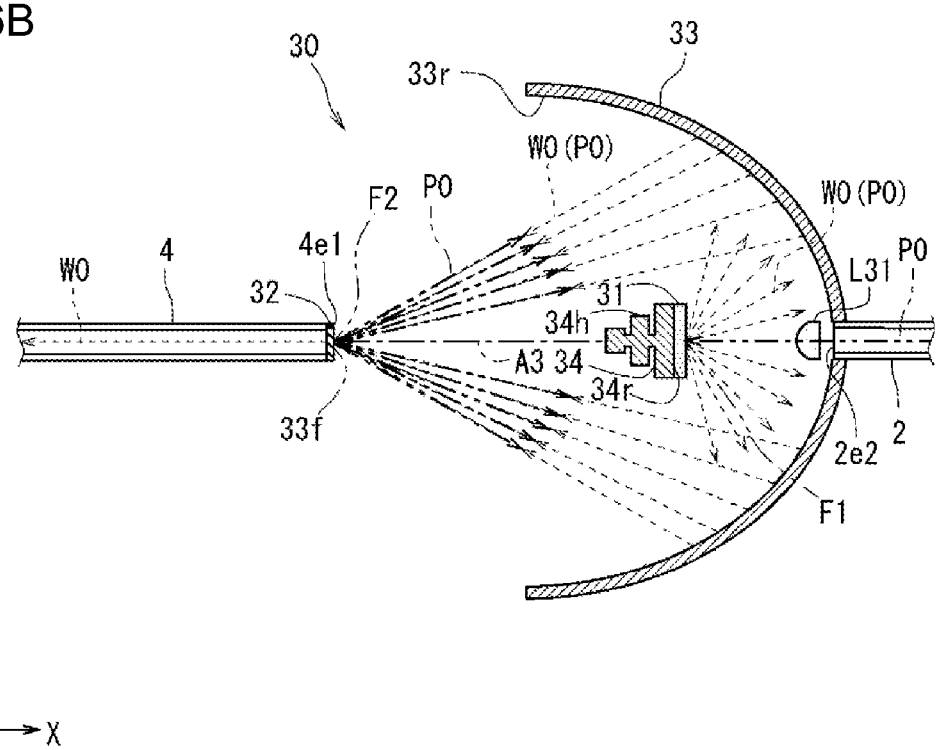
FIG. 6B is a schematic cross-sectional view of the photoconversion device with the third structure according to the third embodiment illustrating conversion of excitation light into fluorescence.
Figure 7A:
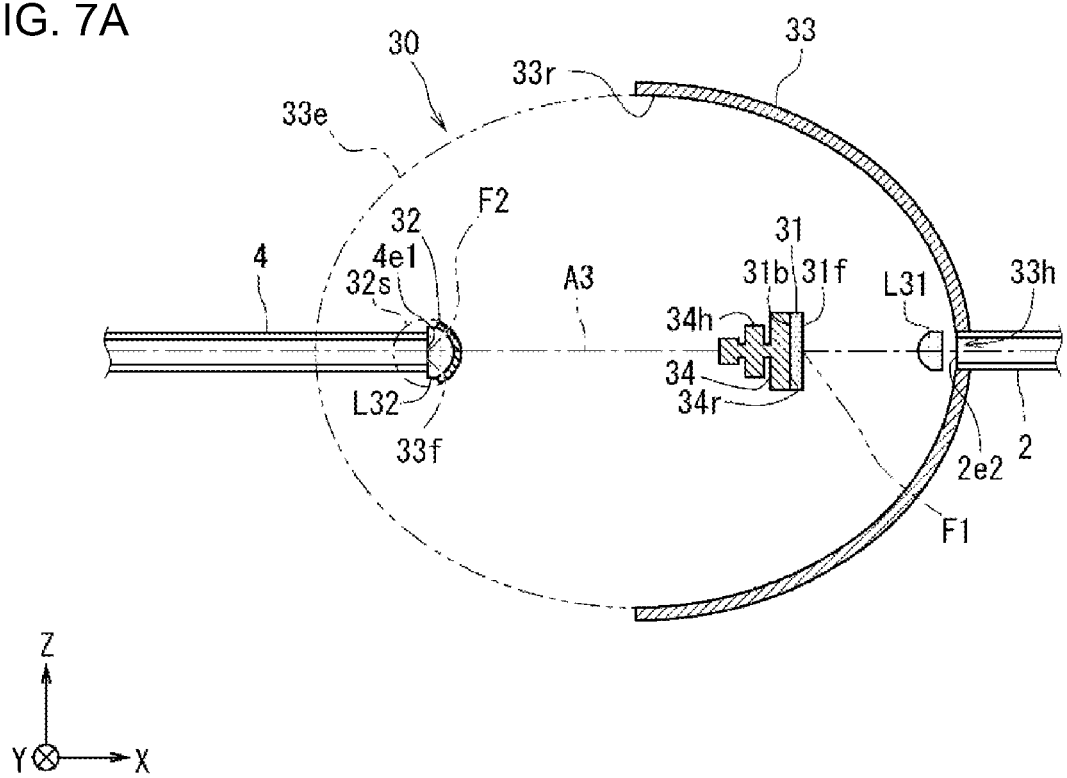
FIG. 7A is a schematic cross-sectional view of a photoconversion device with a fourth structure according to the third embodiment.

A photoconversion device 30 with a third structure according to the third embodiment illustrated in FIGS. 6A and 6B is based on the photoconversion device 30 according to the second embodiment illustrated in FIGS. 3A and 3B, with the shapes, positions, and other structures of the components being changed appropriately. In the photoconversion device 30 with the third structure according to the third embodiment, the optical system L32 is eliminated, the focusing reflector 33 is an ellipsoidal mirror, the first focal point F1 is on the front surface 31$f$ of the wavelength converter 31, the second focal point F2 is along the focusing plane 33$f$, and the long-pass filter 32 has the shape including the surface along the imaginary plane 32$p$ aligned with the focusing plane 33$f$, located on the second input end 4$e$1, and perpendicular to the straight imaginary line A3 passing through the first focal point F1 and the second focal point F2. In this example as well, the excitation light P0 from the long-pass filter 32 reaches the wavelength converter 31 through the reflective surface 33$r$ along an optical path (also referred to as a return path) that is symmetrical with, about the imaginary line A3, the optical path (also referred to as an outward path) of the excitation light P0 from the wavelength converter 31 to the long-pass filter 32 through the reflective surface 33$r$, in the same or similar manner as in the photoconversion device 30 with the first structure according to the third embodiment. This allows, for example, the wavelength converter 31 to emit more fluorescence W0, thus increasing the amount of fluorescence W0 emitted from the photoconversion device 30 and the illumination system 100 in response to the excitation light P0.

Figure 7B:
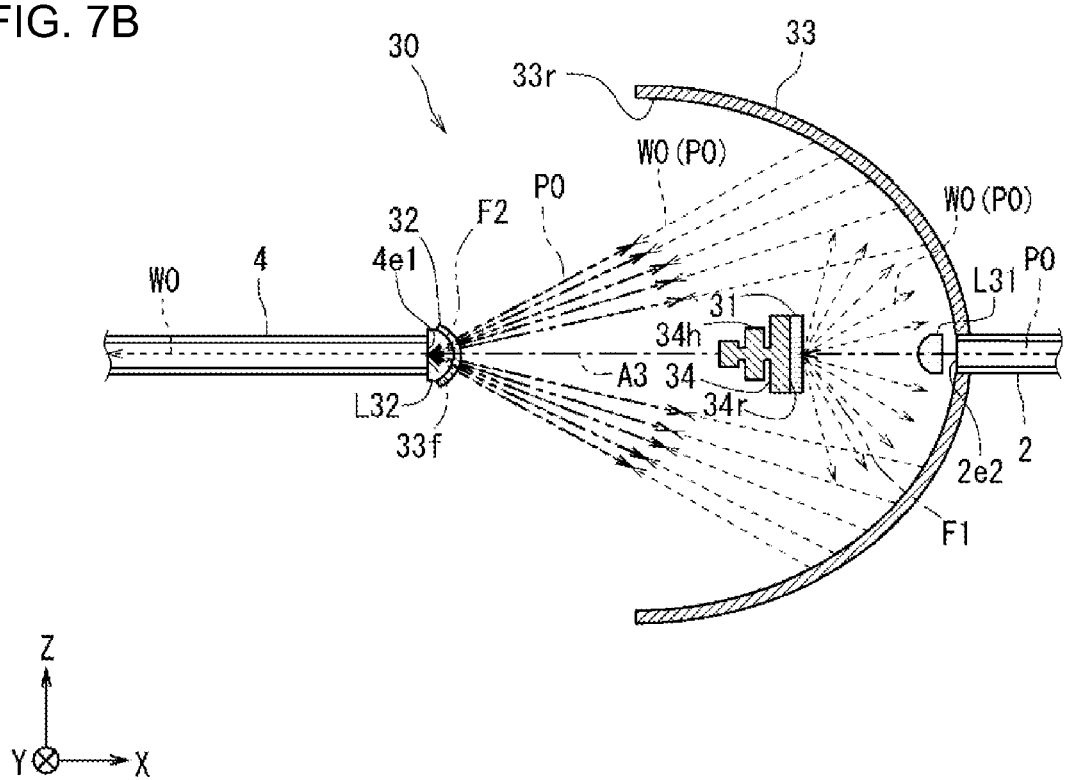
FIG. 7B is a schematic cross-sectional view of the photoconversion device with the fourth structure according to the third embodiment illustrating conversion of excitation light into fluorescence.

A photoconversion device 30 with a fourth structure according to the third embodiment illustrated in FIGS. 7A and 7B is based on the photoconversion device 30 with the second structure according to the third embodiment illustrated in FIGS. 5A and 5B, with the shapes, positions, and other structures of the components being changed appropriately. In the photoconversion device 30 with the fourth structure according to the third embodiment, the wavelength converter 31 includes the front surface 31$f$ facing in the positive X-direction and the back surface 31$b$ facing in the negative X-direction, the reflective member 34 extends in the negative X-direction from the back surface 31$b$, the focusing reflector 33 includes the through-hole 33$h$ aligned with the imaginary line A3, the portion of the first optical transmission fiber 2 including the first output end 2$e$2 is received in the through-hole 33$h$, and the first output end 2$e$2 is located on the imaginary line A3. In this example as well, the excitation light P0 from the long-pass filter 32 reaches the wavelength converter 31 through the reflective surface 33$r$ by following, in the opposite direction, the optical path of the excitation light P0 from the wavelength converter 31 to the long-pass filter 32 through the reflective surface 33$r$, in the same or similar manner as in the photoconversion device 30 with the second structure according to the third embodiment. This allows, for example, the wavelength converter 31 to emit more fluorescence W0, thus increasing the amount of fluorescence W0 emitted from the photoconversion device 30 and the illumination system 100 in response to the excitation light P0.

2-3. Fourth Embodiment

In each of the above embodiments, the long-pass filter 32 may be, for example, at any position on the optical path from the wavelength converter 31 to the focusing plane 33*f*.

Figure 8A:
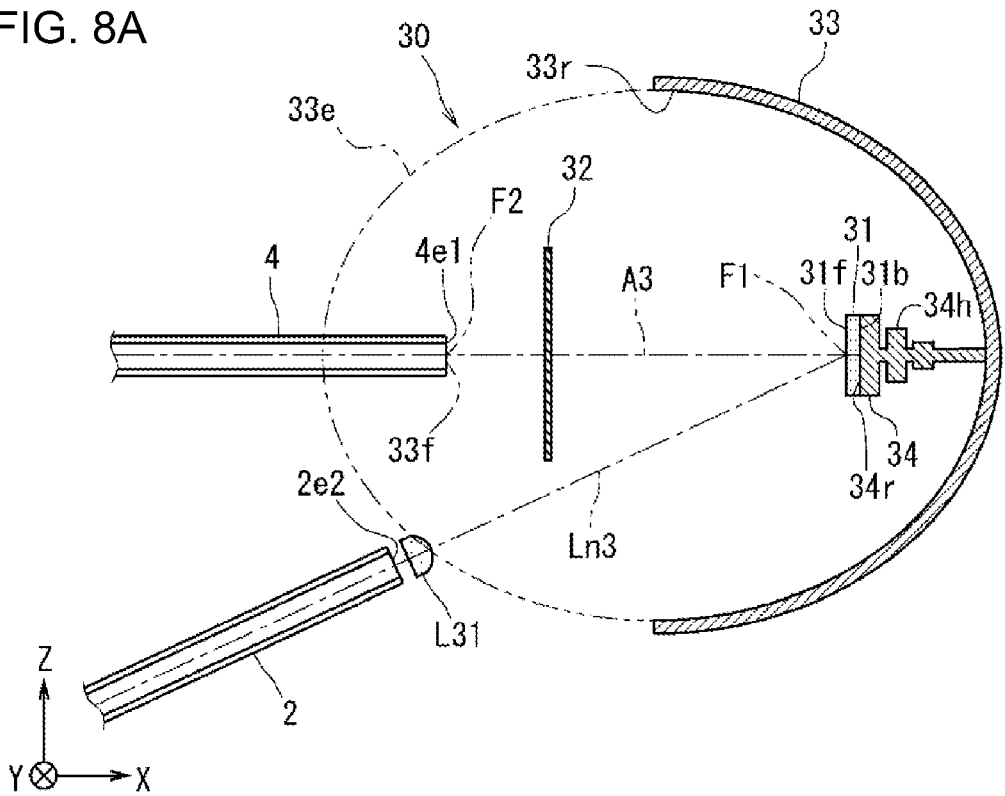
FIG. 8A is a schematic partial cross-sectional view of a photoconversion device with a first structure according to a fourth embodiment.
Figure 8B:
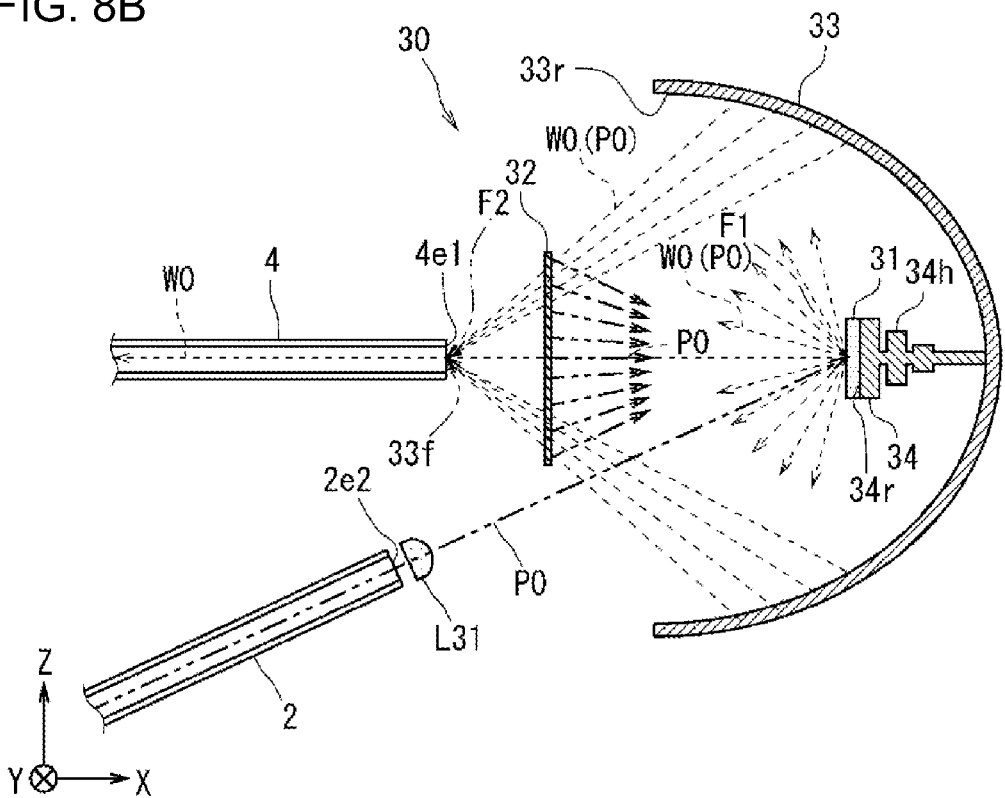
FIG. 8B is a schematic cross-sectional view of the photoconversion device with the first structure according to the fourth embodiment illustrating conversion of excitation light into fluorescence.

A photoconversion device 30 with a first structure according to a fourth embodiment illustrated in FIGS. 8A and 8B is based on the photoconversion device 30 with the first structure according to the third embodiment illustrated in FIGS. 4A and 4B, with the position of the long-pass filter 32 being changed to a position between the second input end 4*e*1 of the second optical transmission fiber 4 and each of the front surface 31*f* of the wavelength converter 31 and the reflective surface 33*r* of the focusing reflector 33.

Figure 9A:
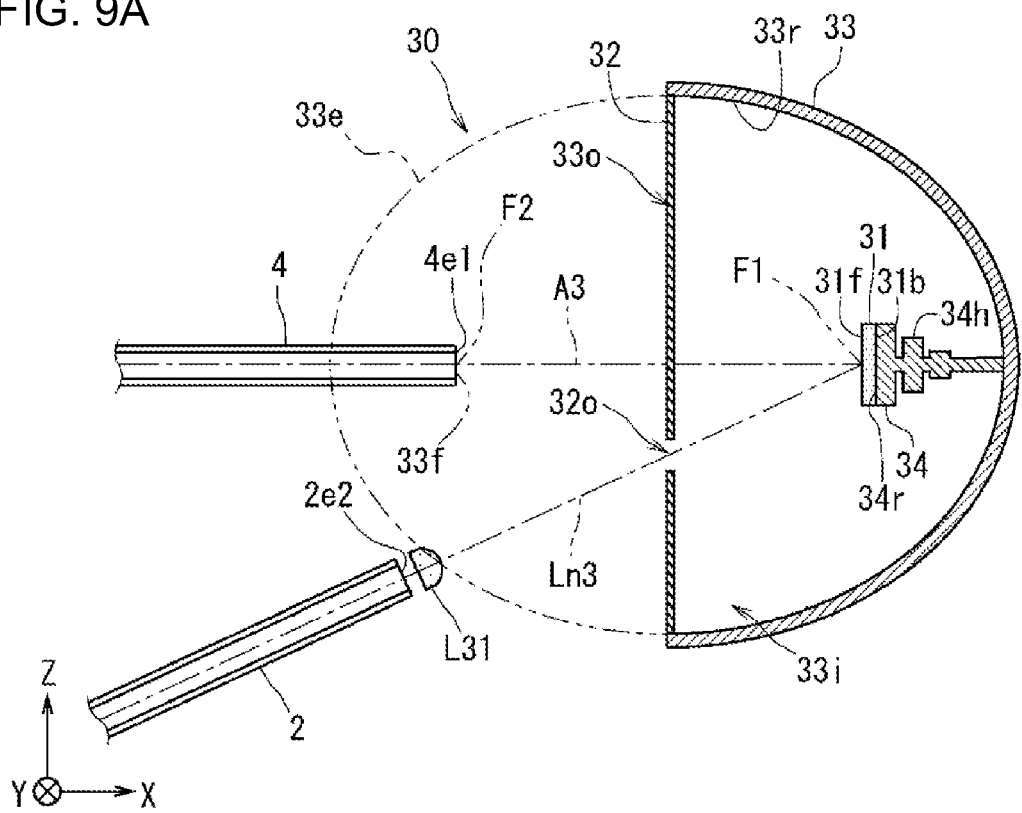
FIG. 9A is a schematic cross-sectional view of a photoconversion device with a second structure according to the fourth embodiment.
Figure 9B:
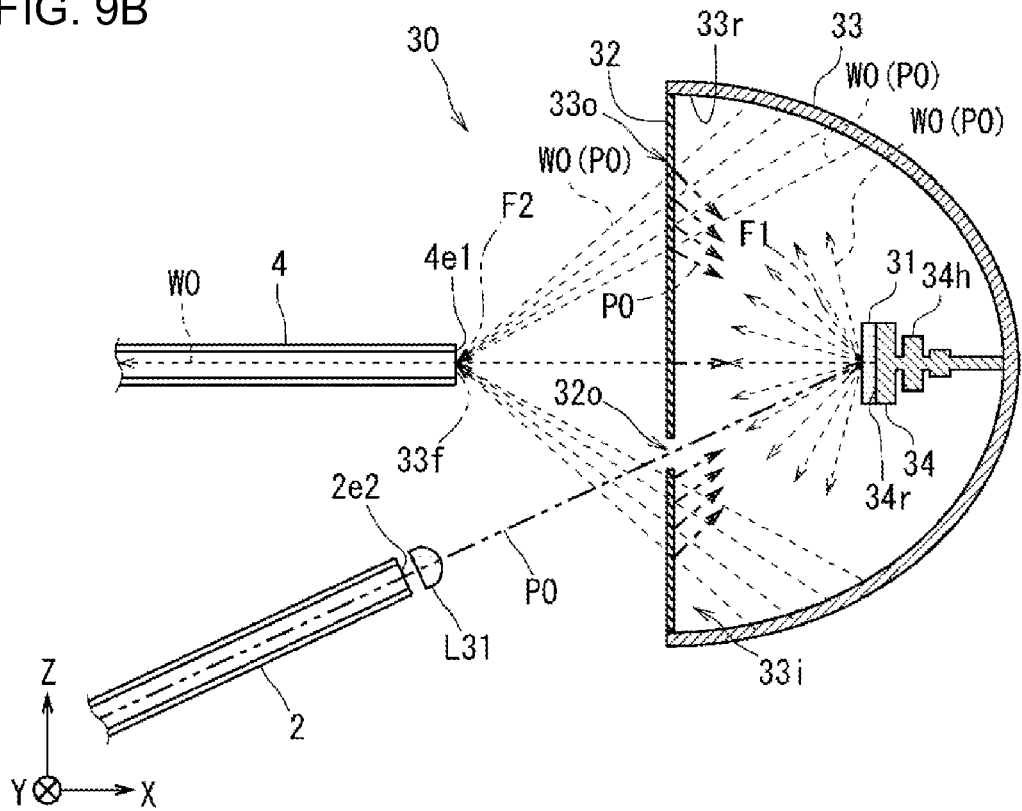
FIG. 9B is a schematic cross-sectional view of the photoconversion device with the second structure according to the fourth embodiment illustrating conversion of excitation light into fluorescence.

A photoconversion device 30 with a second structure according to the fourth embodiment illustrated in FIGS. 9A and 9B is based on the photoconversion device 30 with the first structure according to the fourth embodiment illustrated in FIGS. 8A and 8B, with the position and the shape of the long-pass filter 32 being changed to cover an opening 33*o* of the focusing reflector 33 facing in the negative X-direction and to include a through-hole 32*o* on the optical path of the excitation light P0 from the first output end 2*e*2 to the wavelength converter 31. In other words, the long-pass filter 32 is positioned to cover a space 33*i* (also referred to as an internal space) inside the focusing reflector 33 surrounded by the reflective surface 33*r*.

Figure 10A:
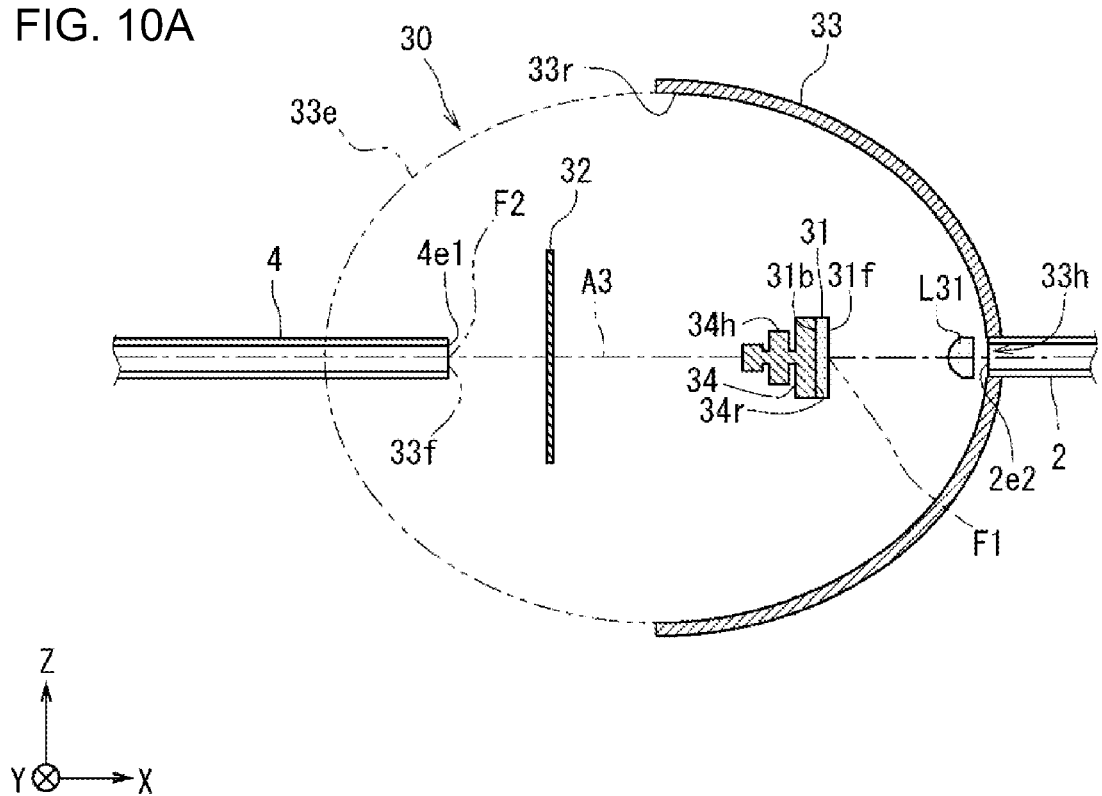
FIG. 10A is a schematic cross-sectional view of a photoconversion device with a third structure according to the fourth embodiment.
Figure 10B:
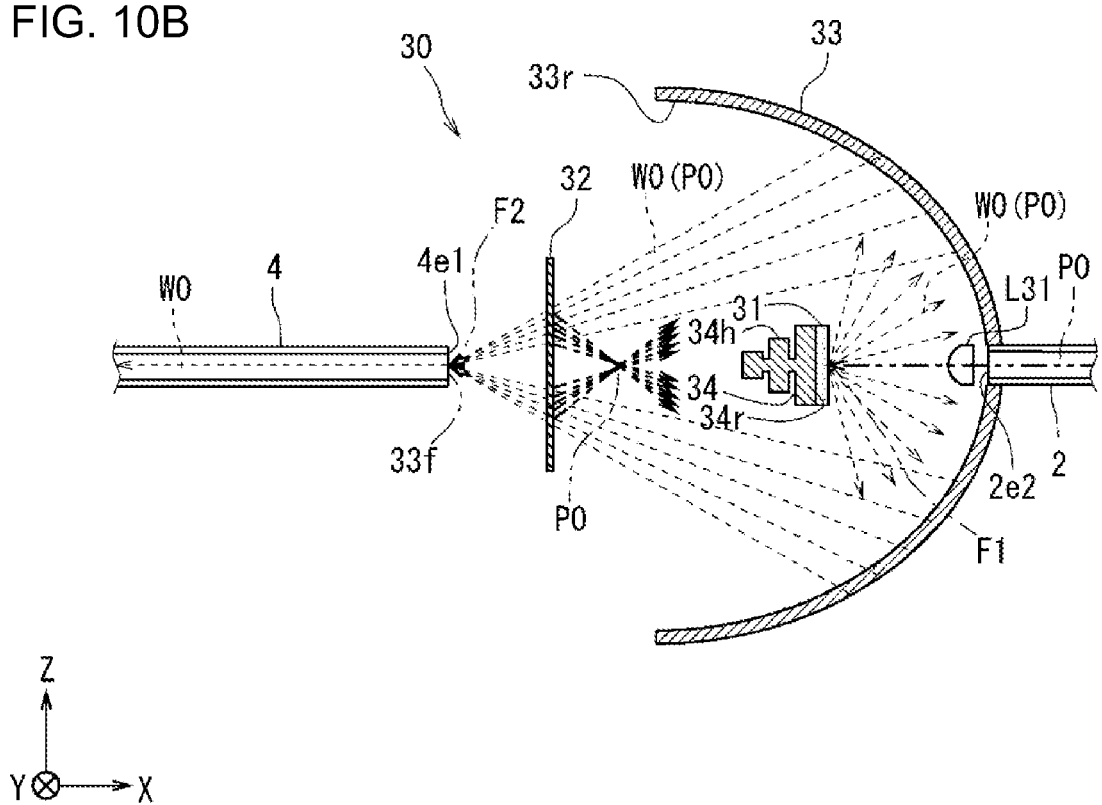
FIG. 10B is a schematic cross-sectional view of the photoconversion device with the third structure according to the fourth embodiment illustrating conversion of excitation light into fluorescence.

A photoconversion device 30 with a third structure according to the fourth embodiment illustrated in FIGS. 10A and 10B is based on the photoconversion device 30 with the third structure according to the third embodiment illustrated in FIGS. 6A and 6B, with the position of the long-pass filter 32 being changed to a position between the second input end 4*e*1 of the second optical transmission fiber 4 and each of the wavelength converter 31, the reflective member 34, and the reflective surface 33*r* of the focusing reflector 33.

Figure 11A:
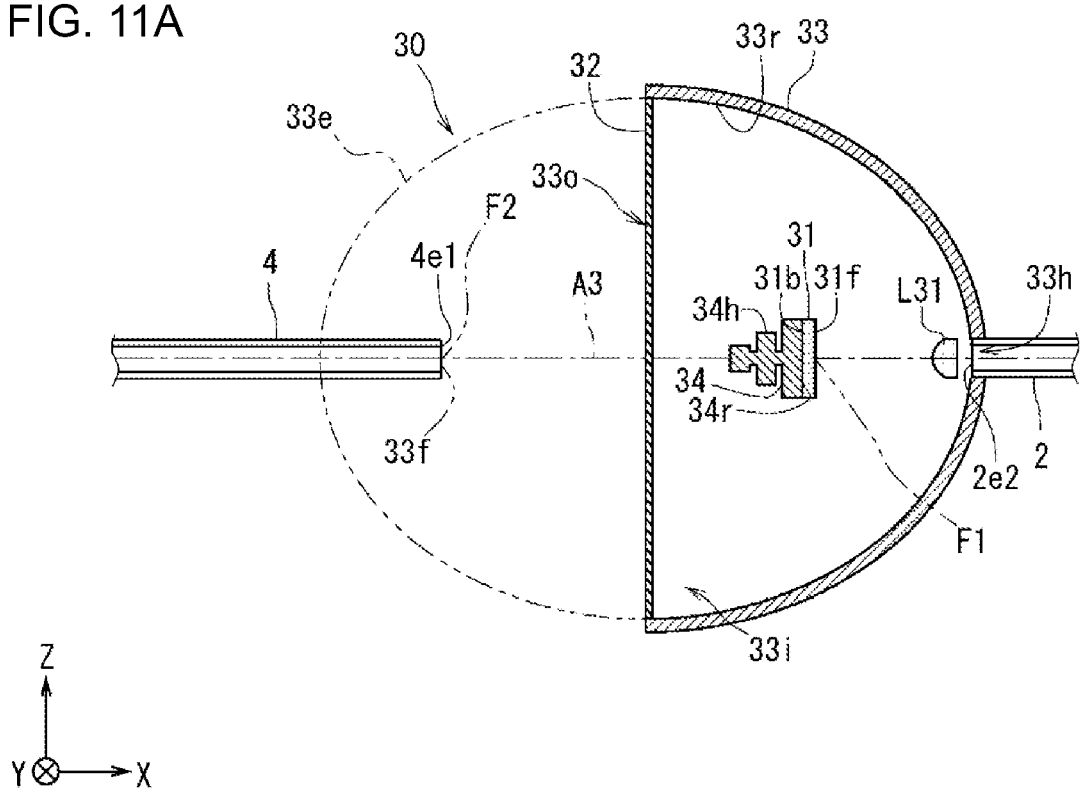
FIG. 11A is a schematic cross-sectional view of a photoconversion device with a fourth structure according to the fourth embodiment.
Figure 11B:
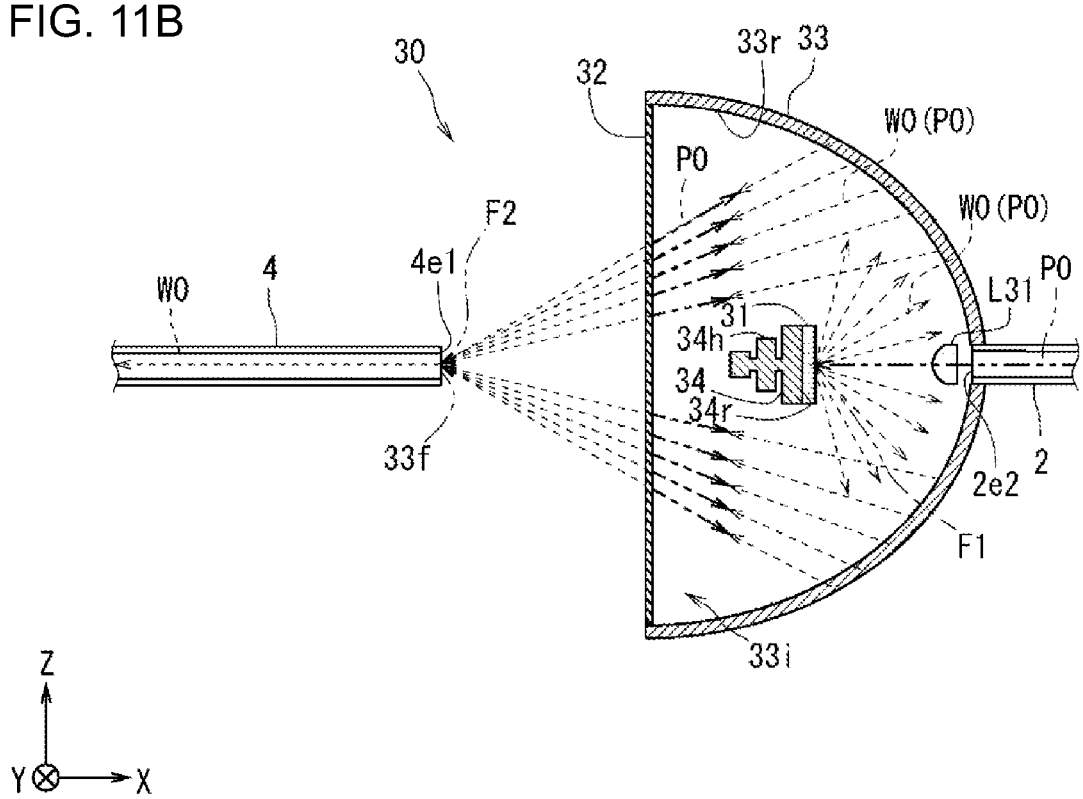
FIG. 11B is a schematic cross-sectional view of the photoconversion device with the fourth structure according to the fourth embodiment illustrating conversion of excitation light into fluorescence.

A photoconversion device 30 with a fourth structure according to the fourth embodiment illustrated in FIGS. 11A and 11B is based on the photoconversion device 30 with the third structure according to the fourth embodiment illustrated in FIGS. 10A and 10B, with the position and the shape of the long-pass filter 32 being changed to cover the opening 33*o* of the focusing reflector 33 facing in the negative X-direction. In other words, the long-pass filter 32 is positioned to cover the internal space 33*i* of the focusing reflector 33 surrounded by the reflective surface 33*r*.

Figure 12A:
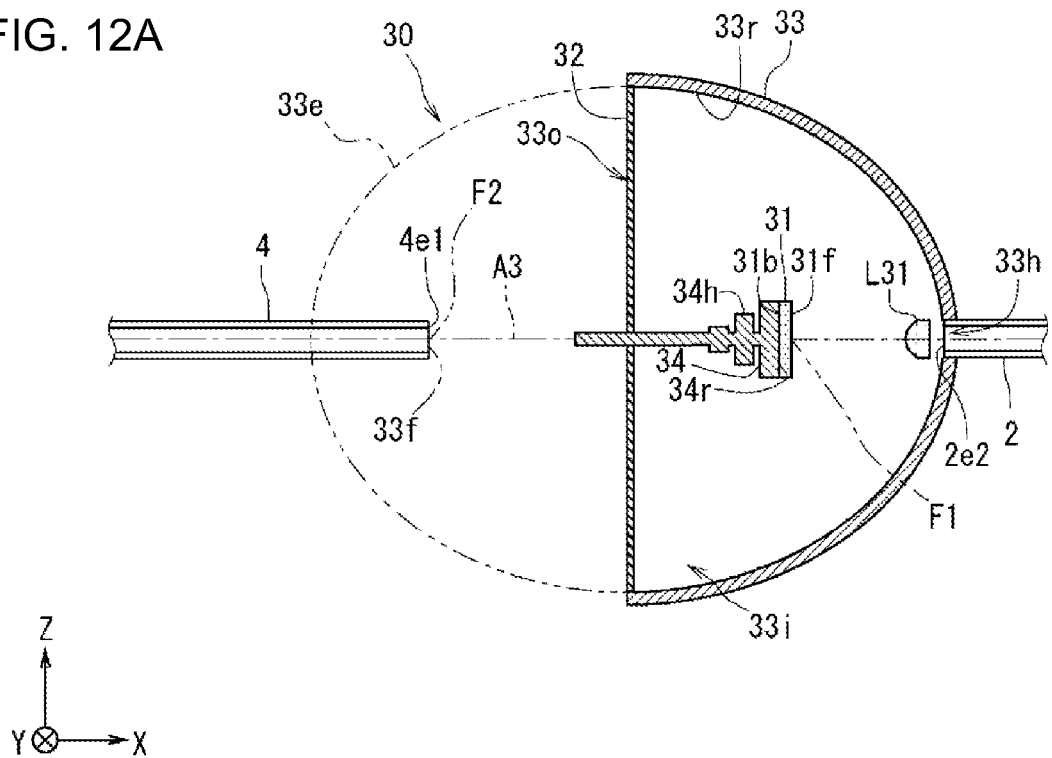
FIG. 12A is a schematic cross-sectional view of a photoconversion device with a fifth structure according to the fourth embodiment.
Figure 12B:
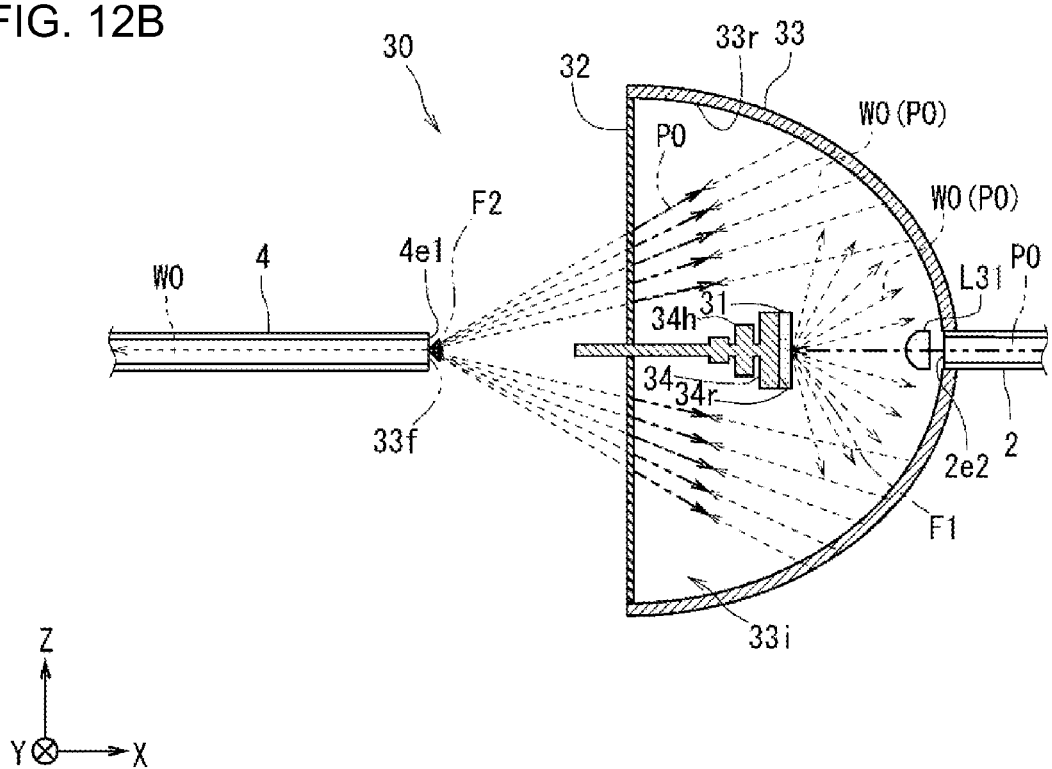
FIG. 12B is a schematic cross-sectional view of the photoconversion device with the fifth structure according to the fourth embodiment illustrating conversion of excitation light into fluorescence.

As in the example illustrated in FIGS. 12A and 12B, a part of the heat sink 34*h* included in the reflective member 34 may extend through the long-pass filter 32 from the internal space 33*i* and protrude from the long-pass filter 32 toward the second input end 4*e*1 of the second optical transmission fiber 4. This accelerates, for example, heat dissipation from the heat sink 34*h* and thus accelerates cooling of the wavelength converter 31, which generates heat under irradiation with the excitation light P0.

Figure 13A:
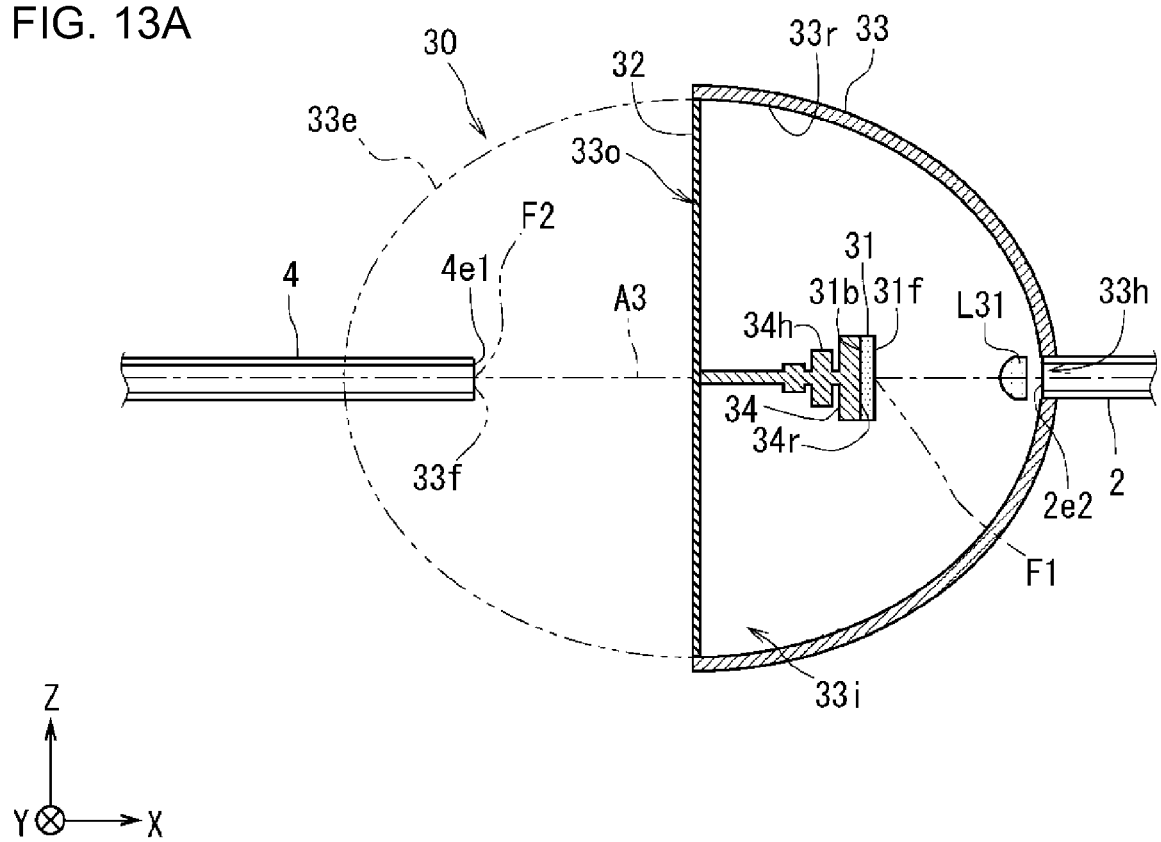
FIG. 13A is a schematic cross-sectional view of a photoconversion device with a sixth structure according to the fourth embodiment.
Figure 13B:
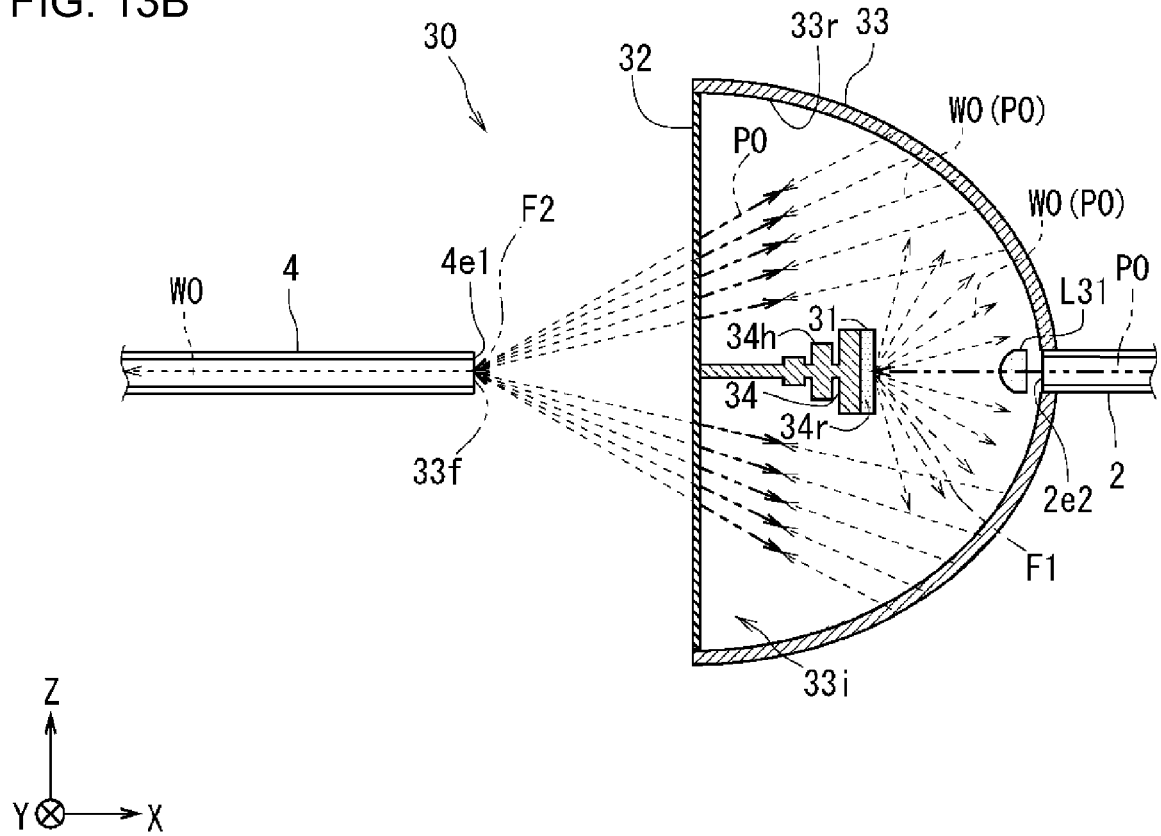
FIG. 13B is a schematic cross-sectional view of the photoconversion device with the sixth structure according to the fourth embodiment illustrating conversion of excitation light into fluorescence.

As in the example illustrated in FIGS. 13A and 13B, a part of the heat sink 34*h* in the reflective member 34 may be in contact with the long-pass filter 32 without extending through the long-pass filter 32. This accelerates, for example, heat dissipation from the heat sink 34*h* through the long-pass filter 32 and thus accelerates cooling of the wavelength converter 31, which generates heat under irradiation with the excitation light P0. The long-pass filter 32 with the simpler structure can be, for example, easily fabricated and placed.

2-4. Fifth Embodiment

In each of the above embodiments, the reflective member 34 may be, for example, eliminated as illustrated in FIGS. 14A to 15B. This structure may allow, for example, the wavelength converter 31 to emit fluorescence W0 from both the front surface 31*f* and the back surface 31*b*.

Figure 14A:
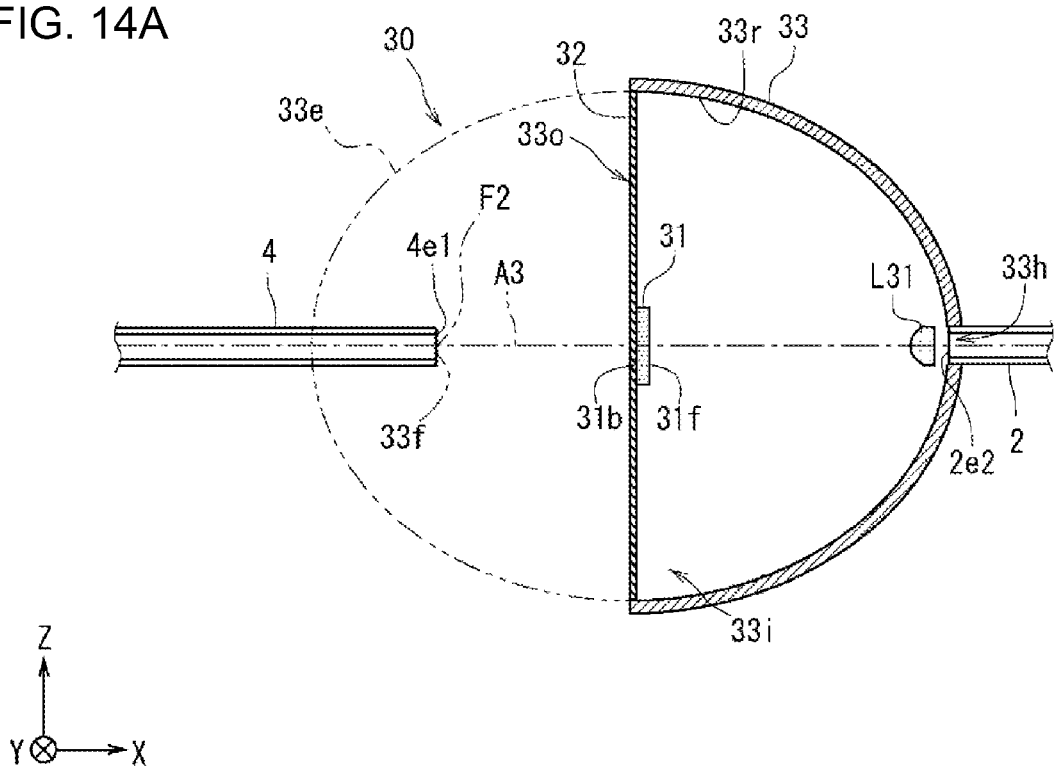
FIG. 14A is a schematic cross-sectional view of a photoconversion device with a first structure according to a fifth embodiment.
Figure 14B:
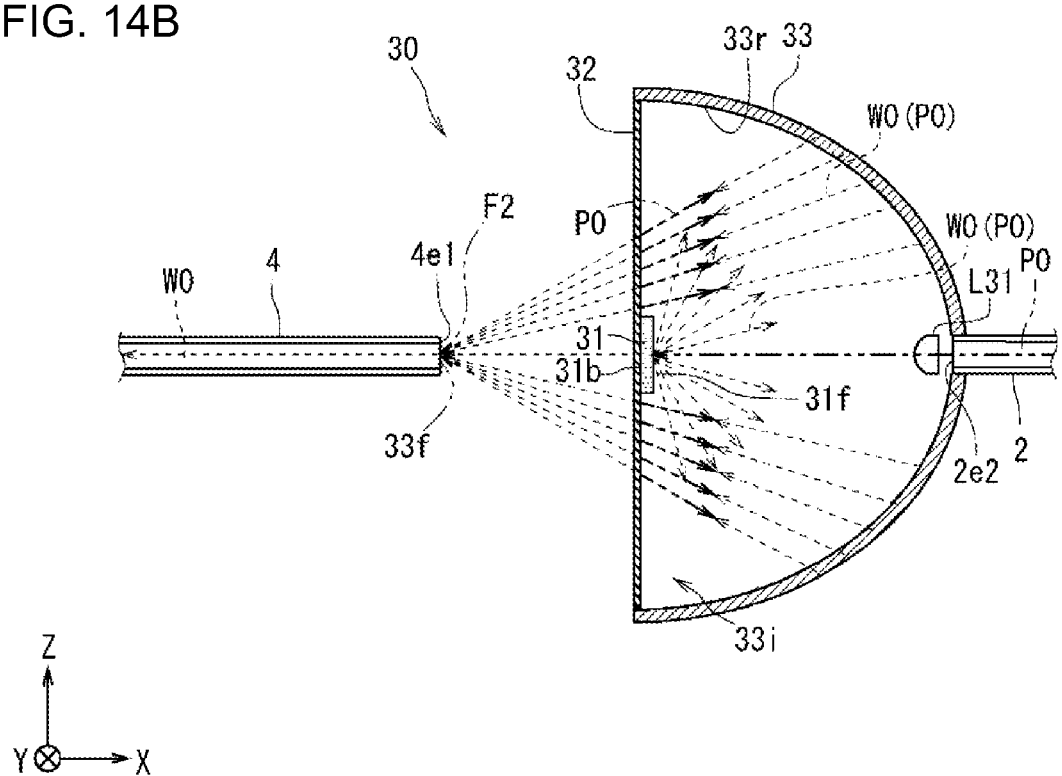
FIG. 14B is a schematic cross-sectional view of the photoconversion device with the first structure according to the fifth embodiment illustrating conversion of excitation light into fluorescence.

A photoconversion device 30 with a first structure according to a fifth embodiment illustrated in FIGS. 14A and 14B is based on the photoconversion device 30 with the fourth structure according to the fourth embodiment illustrated in FIGS. 11A and 11B, with the structures and the positions of the components being changed to eliminate the reflective member 34 and have the wavelength converter 31 located on the surface of the long-pass filter 32 adjacent to the first output end 2*e*2. In this example, the wavelength converter 31 is between the first output end 2*e*2 and the long-pass filter 32. The photoconversion device 30 is thus less likely to be larger. In such a photoconversion device 30, the wavelength converter 31 can emit, for example, fluorescence W0 from both the front surface 31*f* and the back surface 31*b* in response to the front surface 31*f* of the wavelength converter 31 receiving the excitation light P0 output through the first output end 2*e*2. A portion of the excitation light P0 may be, for example, reflected from or transmitted through the wavelength converter 31 to reach the long-pass filter 32 and reflected from the long-pass filter 32 to enter the wavelength converter 31. The wavelength converter 31 can thus emit, for example, more fluorescence W0.

Figure 15A:
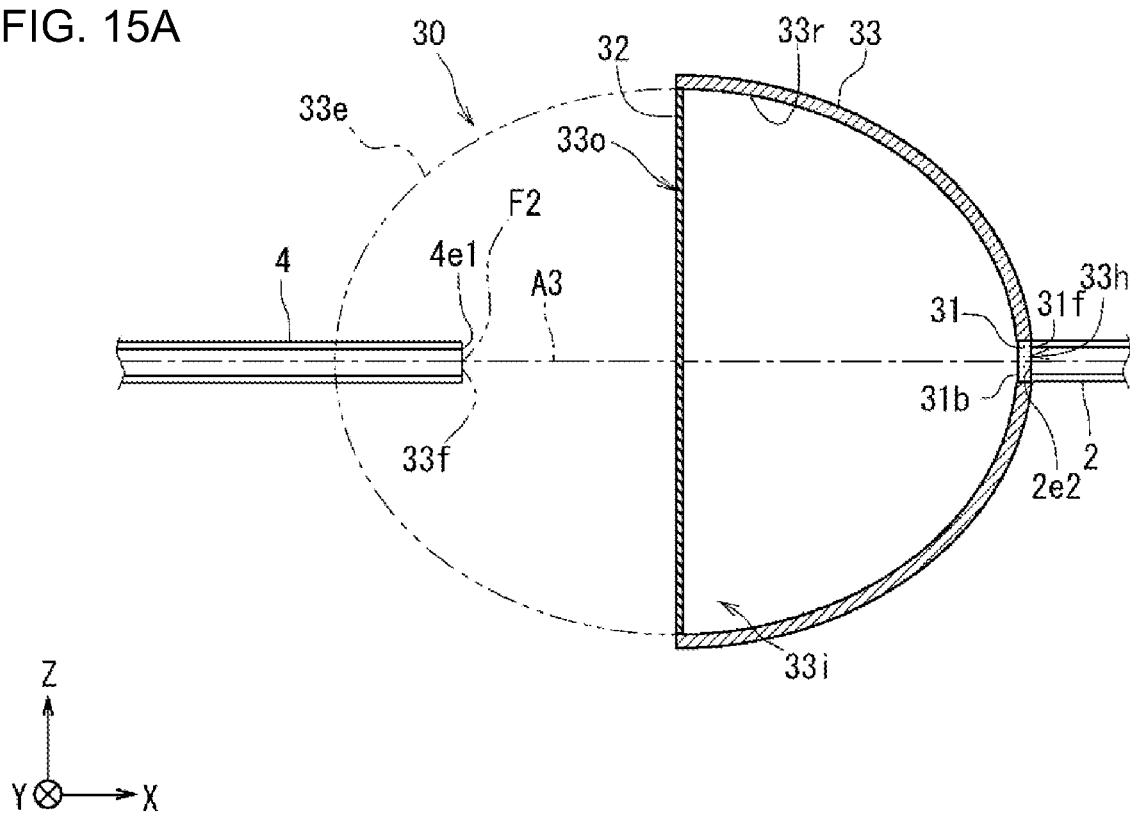
FIG. 15A is a schematic cross-sectional view of a photoconversion device with a second structure according to the fifth embodiment.
Figure 15B:
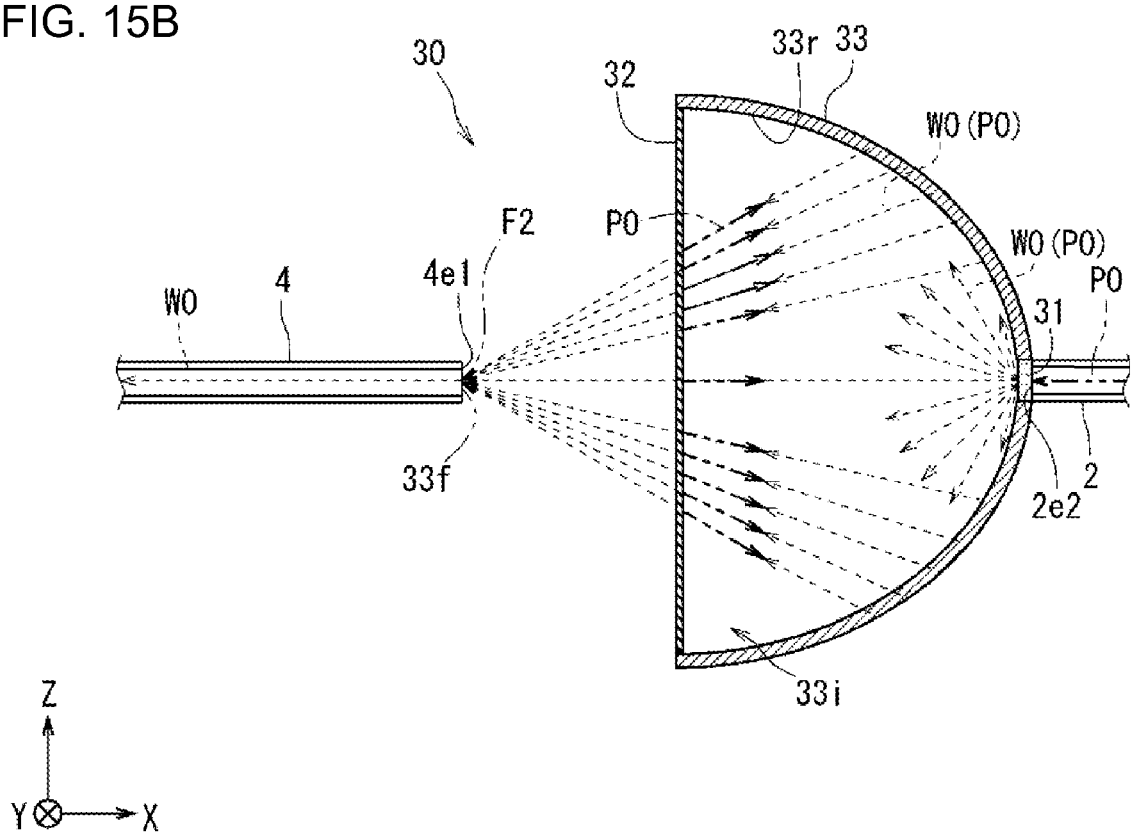
FIG. 15B is a schematic cross-sectional view of the photoconversion device with the second structure according to the fifth embodiment illustrating conversion of excitation light into fluorescence.

A photoconversion device 30 with a second structure according to the fifth embodiment illustrated in FIGS. 15A and 15B is based on the photoconversion device 30 with the first structure according to the fifth embodiment illustrated in FIGS. 14A and 14B, with the structures and the positions of the components being changed to eliminate the optical system L31 and have the wavelength converter 31 located on the first output end 2*e*2. The wavelength converter 31 may be located in the through-hole 33*h*, for example. In this example, in response to the excitation light P0 output through the first output end 2*e*2 being incident on the front surface 31*f* of the wavelength converter 31, the back surface 31*b* of the wavelength converter 31 emits fluorescence W0, which then passes through the long-pass filter 32 and reaches the second input end 4*e*1 of the second optical transmission fiber 4. A portion of the excitation light P0 may, for example, pass through the wavelength converter 31 to reach the long-pass filter 32 and then be reflected from the long-pass filter 32 to enter the wavelength converter 31. The wavelength converter 31 can thus emit, for example, more fluorescence W0.

2-5. Sixth Embodiment

Figure 16A:
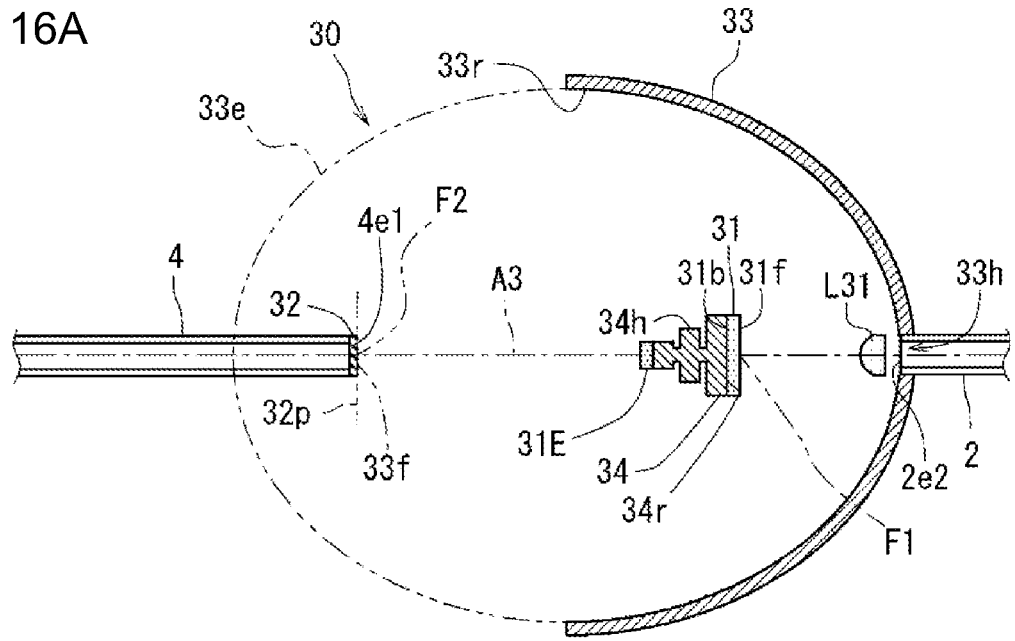
FIG. 16A is a schematic cross-sectional view of an example photoconversion device according to a sixth embodiment.
Figure 16A:
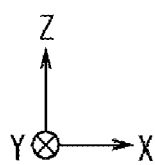
Figure 16B:
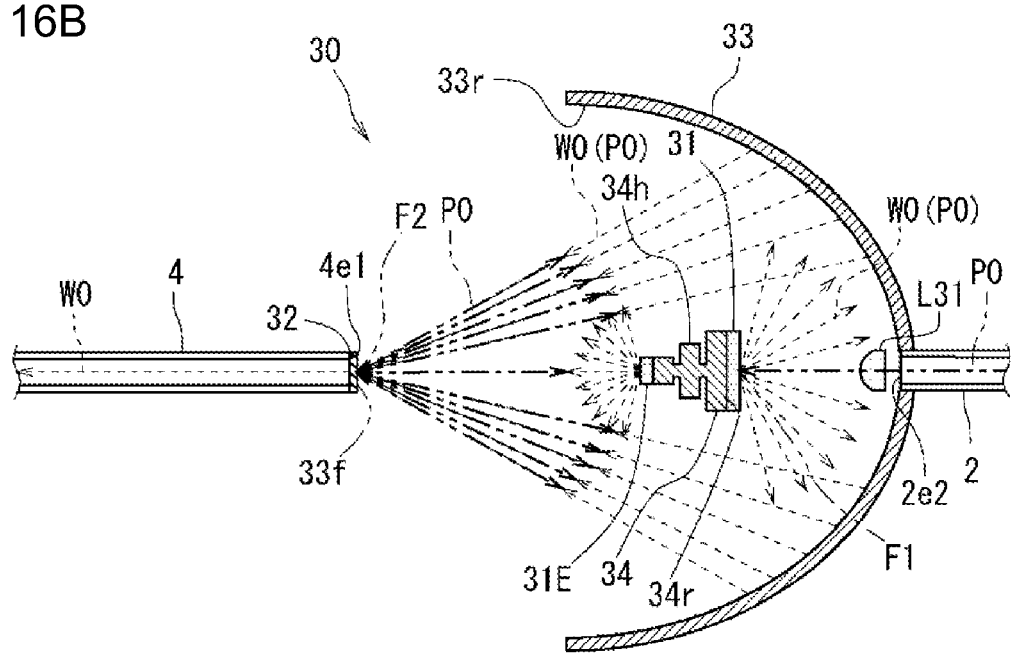
FIG. 16B is a schematic cross-sectional view of the photoconversion device according to the sixth embodiment illustrating conversion of excitation light into fluorescence.
Figure 16B:
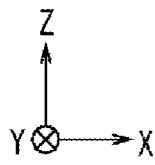

In the above first to fourth embodiments, for example, a wavelength converter 31E as a second wavelength converter different from the wavelength converter 31 may also be located on a surface of the reflective member 34 away from the wavelength converter 31, as illustrated in FIGS. 16A and 16B. In other words, the wavelength converter 31E may be, for example, located on a surface of the reflective member 34 not in contact with the wavelength converter 31. The wavelength converter 31E receiving the excitation light P0 reflected from the long-pass filter 32 can emit, for example, fluorescence W0 having a longer wavelength than the received excitation light P0. The wavelength converter 31E includes, for example, a phosphor member in the same or similar manner as the wavelength converter 31. The wavelength converter 31E can thus emit, for example, fluorescence W0 in response to irradiation with the excitation light P0 reflected from the long-pass filter 32 and directed to the reflective member 34. This may increase, for example, the amount of fluorescence W0 emitted from the photoconversion device 30 and the illumination system 100 in response to the excitation light P0.

A photoconversion device 30 according to a sixth embodiment illustrated in FIGS. 16A and 16B is based on the photoconversion device 30 with the third structure according to the third embodiment illustrated in FIGS. 6A and 6B. The photoconversion device 30 according to the sixth embodiment further includes the wavelength converter 31E on a surface of the heat sink 34h included in the reflective member 34 facing the long-pass filter 32. In this example, the wavelength converter 31E can emit fluorescence W0 in response to the excitation light P0 reflected from the long-pass filter 32. This may increase the amount of fluorescence W0 emitted from the photoconversion device 30 and the illumination system 100 in response to the excitation light P0.

2-6. Seventh Embodiment

Figure 17:
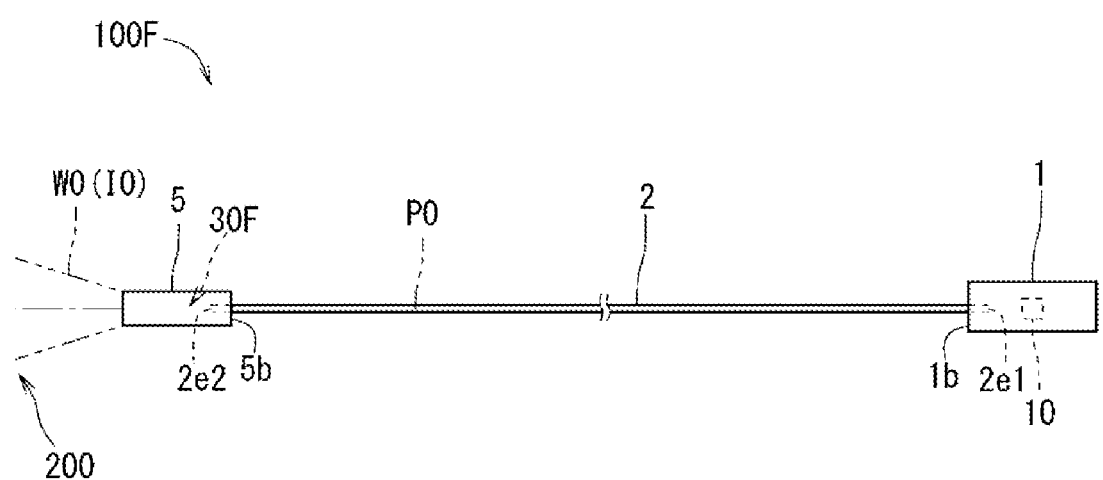
FIG. 17 is a schematic diagram of an example illumination system according to a seventh embodiment.

In each of the above embodiments, for example, the relay 3 and the second optical transmission fiber 4 may be replaced with the first optical transmission fiber 2 extending from the light-emitting module 1 to the optical radiation module 5, and the optical radiation module 5 may include a photoconversion device 30F with the same or similar structure as the photoconversion device 30 according to any one of the first to sixth embodiments, as illustrated in FIG. 17.

As illustrated in FIG. 17, an illumination system 100F according to a seventh embodiment includes, for example, the light-emitting module 1, the first optical transmission fiber 2, and the optical radiation module 5. In this example, the first optical transmission fiber 2 includes the first input end 2e1 located inside the light-emitting module 1 and the first output end 2e2 located inside the optical radiation module 5. The first optical transmission fiber 2 can thus transmit, for example, the excitation light P0 from the light-emitting module 1 to the optical radiation module 5. In the optical radiation module 5, for example, the photoconversion device 30F can receive the excitation light P0 output through the first output end 2e2 of the first optical transmission fiber 2 as the output portion to emit fluorescence W0 having a wavelength longer than the received excitation light P0. The optical radiation module 5 can then radiate, for example, the fluorescence W0 emitted from the photoconversion device 30F as illumination light I0 into the external space 200 of the illumination system 100F.

In this structure as well, the photoconversion device 30F includes, for example, the wavelength converter 31, which receives the excitation light P0 output through the first output end 2e2 of the first optical transmission fiber 2 as the output portion and emits fluorescence W0, and the long-pass filter 32, which transmits the fluorescence W0 emitted by the wavelength converter 31 into, for example, the external space 200 and reflects the excitation light P0 transmitted through or reflected from the wavelength converter 31 to enter the wavelength converter 31. The wavelength converter 31 can thus emit, for example, more fluorescence W0 with the excitation light P0 reflected from the long-pass filter 32. This may increase, for example, the amount of fluorescence W0 emitted from the photoconversion device 30F and the illumination system 100F in response to the excitation light P0. In the illumination system 100F, for example, the wavelength converter 31 in the optical radiation module 5 emits fluorescence W0 in response to the excitation light P0 transmitted by the first optical transmission fiber 2 from the light-emitting module 1. This structure reduces optical transmission loss that may occur when, for example, the fluorescence W0 travels in the optical transmission fiber in a direction inclined at various angles to the longitudinal direction of the optical transmission fiber and is partly scattered during transmission. Thus, the illumination system 100F can radiate, for example, more fluorescence W0 in response to the excitation light P0.

An optical radiation module 5 with a first structure according to the seventh embodiment illustrated in FIGS. 18A and 18B includes the photoconversion device 30F and an optical radiator 50. In this example, the photoconversion device 30F has the same or similar structure as the photoconversion device 30 according to the third embodiment illustrated in FIGS. 6A and 6B. The optical radiator 50 includes, for example, an optical transmitter 51 and an optical system L53. The optical transmitter 51 can transmit, for example, the fluorescence W0 from the focusing plane 33f toward the optical system L53. The optical transmitter 51 includes, for example, an optical fiber or a cylindrical member with a mirror-like inner surface. The optical transmitter 51 includes, for example, one end (also referred to as a third input end) 5e1 for receiving entry of the fluorescence W0 and another end (also referred to as a third output end) 5e2 for outputting the fluorescence W0. The third output end 5e2 is located opposite to the third input end 5e1. In the example of FIGS. 18A and 18B, the long-pass filter 32 is located along the focusing plane 33f and on the third input end 5e1. The optical system L53 is located along, for example, the third output end 5e2 of the optical transmitter 51. The optical system L53 can radiate, for example, the fluorescence W0 transmitted by the optical transmitter 51 into the external space 200 at an intended angle of light distribution. The optical system L53 may include, for example, a lens or a diffuser. In this structure, for example, the optical radiation module 5 can have a smaller portion to radiate the fluorescence W0 into the external space 200 as illumination light I0.

Figure 19A:
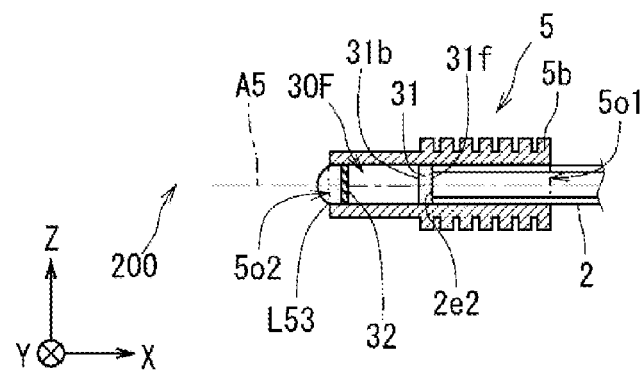
FIG. 19A is a schematic cross-sectional view of an optical radiation module with a second structure according to the seventh embodiment.
Figure 19B:
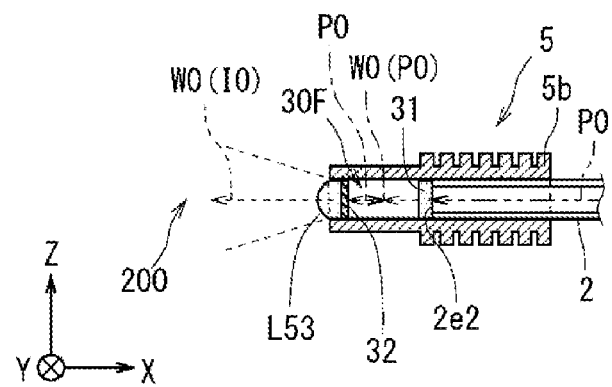
FIG. 19B is a schematic cross-sectional view of the optical radiation module with the second structure according to the seventh embodiment illustrating conversion of excitation light into fluorescence.

An optical radiation module 5 with a second structure according to the seventh embodiment illustrated in FIGS. 19A and 19B includes the cylindrical housing 5b, the photoconversion device 30F, and the optical system L53. The cylindrical housing 5b may be, for example, a cylindrical member with a straight imaginary line A5 as its central axis. In the example of FIGS. 19A and 19B, the imaginary line A5 is an axis extending in X-direction. In this example, the cylindrical housing 5b has one opening (also referred to as a first opening) 5o1 receiving a portion of the first optical transmission fiber 2 including the first output end 2e2. The cylindrical housing 5b has, opposite to the first opening 5o1, another opening (also referred to as a second opening) 5o2 at which the optical system L53 is located. The cylindrical housing 5b accommodates the photoconversion device 30F in its internal space. The photoconversion device 30F includes the wavelength converter 31 and the long-pass filter 32, without including the focusing reflector 33. The cylindrical housing 5b accommodates, in its internal space, the wavelength converter 31 and the long-pass filter 32 arranged in this order in the direction from the first output end 2e2 to the second opening 5o2 (negative X-direction). In this structure, for example, in response to the wavelength converter 31 receiving the excitation light P0 transmitted by the first optical transmission fiber 2, the fluorescence W0 emitted from the back surface 31b of the wavelength converter 31 passes through the long-pass filter 32 and is radiated into the external space 200 as illumination light I0 through the optical system L53, as illustrated in FIG. 19B. A portion of the excitation light P0 is, for example, transmitted through the wavelength converter 31 to reach the long-pass filter 32 and reflected from the long-pass filter 32 to enter the wavelength converter 31. This causes, for example, the excitation light P0 reflected from the long-pass filter 32 to be incident on the back surface 31b of the wavelength converter 31, which then emits more fluorescence W0 from the back surface 31b. This may increase, for example, the amount of fluorescence W0 emitted from the photoconversion device 30F and the illumination system 100F in response to the excitation light P0. In this example, the housing 5b including heat-dissipating fins may efficiently dissipate heat generated by the wavelength converter 31 under irradiation with the excitation light P0 into the external space 200. This may reduce, for example, performance degradation of the wavelength converter 31 resulting from overheating, thus also reducing overheating in the optical radiation module 5.

2-7. Eighth Embodiment

Figure 20:
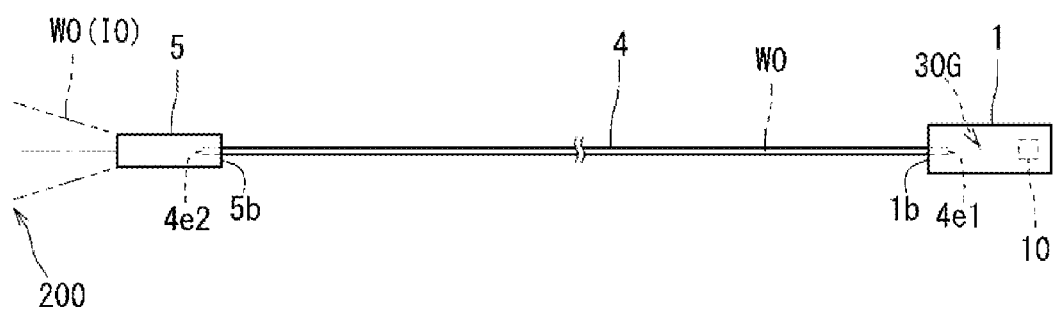
FIG. 20 is a schematic diagram of an example illumination system according to an eighth embodiment.

In each of the above first to sixth embodiments, for example, the relay 3 and the first optical transmission fiber 2 may be replaced with the second optical transmission fiber 4 extending from the light-emitting module 1 to the optical radiation module 5, and the light-emitting module 1 may include a photoconversion device 30G with the same or similar structure as the photoconversion device 30 according to any one of the first to sixth embodiments, as illustrated in FIG. 20.

As illustrated in FIG. 20, an illumination system 100G according to an eighth embodiment includes, for example, the light-emitting module 1, the second optical transmission fiber 4, and the optical radiation module 5. In this example, the second optical transmission fiber 4 includes the second input end 4e1 located inside the light-emitting module 1 and the second output end 4e2 located inside the optical radiation module 5. The second optical transmission fiber 4 can thus, for example, transmit the fluorescence W0 from the light-emitting module 1 to the optical radiation module 5. In the light-emitting module 1, for example, the photoconversion device 30G can receive the excitation light P0 emitted by the light-emitting element 10 as the output portion to emit fluorescence W0 having a wavelength longer than the received excitation light P0. The fluorescence W0 emitted from the photoconversion device 30G in the light-emitting module 1 is, for example, transmitted to the optical radiation module 5 by the second optical transmission fiber 4. The optical radiation module 5 can then radiate, for example, the fluorescence W0 transmitted by the second optical transmission fiber 4 into the external space 200 of the illumination system 100G as illumination light I0.

In this structure as well, the photoconversion device 30G includes, for example, the wavelength converter 31, which receives the excitation light P0 emitted by the light-emitting element 10 as the output portion to emit fluorescence W0, and the long-pass filter 32, which transmits the fluorescence W0 emitted by the wavelength converter 31 toward, for example, the second input end 4e1 of the second optical transmission fiber 4 and reflects the excitation light P0 transmitted through or reflected from the wavelength converter 31 to enter the wavelength converter 31. The wavelength converter 31 can thus emit, for example, more fluorescence W0 with the excitation light P0 reflected from the long-pass filter 32. This may increase, for example, the amount of fluorescence W0 emitted from the photoconversion device 30G and the illumination system 100G in response to the excitation light P0. In the illumination system 100G, the optical radiation module 5 eliminates, for example, the wavelength converter 31. The optical radiation module 5 is thus less likely to undergo temperature increase and can be miniaturized. The structure thus allows, for example, miniaturization of the optical radiation module 5 that radiates illumination light I0 into the external space 200 of the illumination system 100G while increasing the amount of fluorescence W0 emitted from the illumination system 100G in response to the excitation light P0.

A light-emitting module 1 according to the eighth embodiment illustrated in FIGS. 21A and 21B includes the light-emitting element 10 and the photoconversion device 30G. In this example, the photoconversion device 30G has the same or similar structure as the photoconversion device 30 with the third structure according to the third embodiment illustrated in FIGS. 6A and 6B. In the example of FIGS. 21A and 21B, excitation light P0 is emitted from an output portion 10f of the light-emitting element 10 toward the wavelength converter 31, instead of through the first output end 2e2 of the first optical transmission fiber 2.

3. Others

In each of the above embodiments, for example, the predetermined wavelength that defines the lower limit of the wavelength of light transmitted through the long-pass filter 32 may be set to, for example, any value longer than or equal to 450 nm. This allows, for example, the illumination light I0 to be light with no blue light component or to be reddish light. In other words, for example, the illumination light I0 can be controlled by setting the predetermined wavelength for the long-pass filter 32 as appropriate.

In each of the above embodiments, for example, the focusing reflector 33 may be eliminated when the front surface 31f of the wavelength converter 31 and the long-pass filter 32 face each other.

The components described in the above embodiments and variations may be entirely or partially combined as appropriate unless any contradiction arises.

The invention claimed is:
1. A photoconversion device, comprising:
a first wavelength converter configured to receive excitation light from an output portion and emit fluorescence having a longer wavelength than the excitation light;
a long-pass filter configured to transmit the fluorescence emitted by the first wavelength converter and reflect the excitation light transmitted through or reflected from the first wavelength converter to enter the first wavelength converter;
a reflective member; and
a second wavelength converter on a surface of the reflective member away from the first wavelength converter, the second wavelength converter being configured to receive the excitation light reflected from the long-pass filter and emit fluorescence having a longer wavelength than the reflected excitation light, wherein the first wavelength converter includes a front surface to receive the excitation light from the output portion and a back surface opposite to the front surface, and the reflective member is in contact with the back surface.

2. The photoconversion device according to claim 1, wherein the reflective member includes a heat sink.

3. The photoconversion device according to claim 1, wherein the first wavelength converter is between the output portion and the long-pass filter.

4. The photoconversion device according to claim 1, further comprising:

a focusing reflector configured to direct the fluorescence emitted by the first wavelength converter to be focused on a focusing plane, wherein the long-pass filter is on the focusing plane or on an optical path extending from the first wavelength converter to the focusing plane.

5. The photoconversion device according to claim 4, wherein the focusing reflector includes an ellipsoidal mirror with a reflective surface along an ellipsoid, the ellipsoid includes a first focal point in or along the first wavelength converter, and the ellipsoid includes a second focal point on or along the focusing plane, and the second focal point is different from the first focal point.

6. The photoconversion device according to claim 5, wherein the long-pass filter is along the focusing plane and has a shape including a surface along a plane perpendicular to a straight imaginary line passing through the first focal point and the second focal point.

7. The photoconversion device according to claim 5, wherein the long-pass filter has a convex shape facing the first focal point and includes a surface along a sphere centered at the second focal point.

8. The photoconversion device according to claim 1, wherein the output portion includes an output end of an optical transmission fiber.

9. The photoconversion device according to claim 4, wherein the focusing plane is aligned with an input end of an optical transmission fiber.

10. An illumination system, comprising:

a light-emitting module configured to emit excitation light;

a first optical transmission fiber configured to transmit the excitation light from the light-emitting module;

a relay including the photoconversion device according to claim 1;

a second optical transmission fiber configured to transmit the fluorescence from the relay; and an optical radiation module configured to radiate the fluorescence transmitted by the second optical transmission fiber into an external space, wherein the output portion includes an output end of the first optical transmission fiber.

\* \* \* \* \*